US009472764B2

United States Patent
Marks et al.

(10) Patent No.: US 9,472,764 B2
(45) Date of Patent: Oct. 18, 2016

(54) CONJUGATED POLYMERS AND THEIR USE IN OPTOELECTRONIC DEVICES

(71) Applicants: Polyera Corporation, Skokie, IL (US); Northwestern University, Evanston, IL (US)

(72) Inventors: Tobin J. Marks, Evanston, IL (US); Xugang Guo, Evanston, IL (US); Nanjia Zhou, Chicago, IL (US); Robert P. H. Chang, Glenview, IL (US); Martin Drees, Glenview, IL (US); Antonio Facchetti, Chicago, IL (US)

(73) Assignees: Northwestern University, Evanston, IL (US); Polyera Corporation, Skokie, IL (US)

( * ) Notice: Subject to any disclaimer, the term of this patent is extended or adjusted under 35 U.S.C. 154(b) by 742 days.

(21) Appl. No.: 13/844,725

(22) Filed: Mar. 15, 2013

(65) Prior Publication Data

US 2015/0357590 A1    Dec. 10, 2015

Related U.S. Application Data

(60) Provisional application No. 61/733,300, filed on Dec. 4, 2012.

(51) Int. Cl.
| | | |
|---|---|---|
| C08G 75/00 | (2006.01) | |
| H01L 51/00 | (2006.01) | |
| H01L 51/42 | (2006.01) | |
| B82Y 10/00 | (2011.01) | |
| C08G 61/12 | (2006.01) | |

(52) U.S. Cl.
CPC ............ *H01L 51/0036* (2013.01); *B82Y 10/00* (2013.01); *H01L 51/4253* (2013.01); *C08G61/124* (2013.01); *C08G 61/126* (2013.01); *C08G 2261/124* (2013.01); *C08G 2261/1412* (2013.01); *C08G 2261/3223* (2013.01); *C08G 2261/344* (2013.01); *C08G 2261/414* (2013.01); *C08G 2261/91* (2013.01); *C08G 2261/92* (2013.01); *C08G 2261/95* (2013.01); *H01L 51/0043* (2013.01); *H01L 51/0047* (2013.01); *Y02E 10/549* (2013.01)

(58) Field of Classification Search
CPC ............ H01L 51/0036; H01L 51/4253; H01L 51/0047; H01L 51/0043; C08G 2261/124; C08G 2261/1412; C08G 2261/3223; C08G 2261/344; C08G 2261/414; C08G 2261/91; C08G 2261/92; C08G 2261/95
See application file for complete search history.

(56) References Cited

U.S. PATENT DOCUMENTS

| | | | |
|---|---|---|---|
| 8,835,598 B2 | 9/2014 | Pan et al. | 528/377 |
| 8,841,409 B2 | 9/2014 | Facchetti et al. | 528/377 |
| 8,859,714 B1 | 10/2014 | Marks et al. | 528/321 |
| 2012/0097935 A1* | 4/2012 | Kirner | C07D 233/28 257/40 |

FOREIGN PATENT DOCUMENTS

| | | | | |
|---|---|---|---|---|
| CN | 102372839 | * | 3/2014 | H01L 51/54 |
| WO | 2009/115413 | | 9/2009 | |

OTHER PUBLICATIONS

Letizia et al: "n-Channel Polymers by Design: Optimizing the Interplay of Solubilizing Substituents, Crystal Packing, and Field-Effect Transistor Characteristics in Polymeric Bithiophene-Imide Semiconductors", *J. Am. Chem. Soc.*, 130: 9679-9694 (2008).

Zhou et al.: "Bithiophene imide and benzodithiophene copolymers for efficient inverted polymer solar cells", *Adv. Mater.*, 24(17): 2242-2248 (Mar. 26, 2012).

Guo et al.: "Bithiopheneimide-Dithienosilole/Dithienogermole Copolymers for Efficient Soar Cells: Information from Structure-Property-Device Performance Correlations and Comparsion to Theino [3,4-c] pyrrole-4, 6-dione Analogues", *J. Am. Chem. Soc.*, 44: 18427-18439 (Oct. 3, 2012).

* cited by examiner

*Primary Examiner* — Shane Fang
(74) *Attorney, Agent, or Firm* — Karen K. Chan

(57) ABSTRACT

The present invention relates to certain polymeric compounds and their use as organic semiconductors in organic and hybrid optical, optoelectronic, and/or electronic devices such as photovoltaic cells, light emitting diodes, light emitting transistors, and field effect transistors. The present compounds can provide improved device performance, for example, as measured by power conversion efficiency, fill factor, open circuit voltage, field-effect mobility, on/off current ratios, and/or air stability when used in photovoltaic cells or transistors. The present compounds can have good solubility in common solvents enabling device fabrication via solution processes.

11 Claims, 4 Drawing Sheets

US 9,472,764 B2

CONJUGATED POLYMERS AND THEIR USE IN OPTOELECTRONIC DEVICES

CROSS-REFERENCE TO RELATED APPLICATIONS

This application claims priority to and the benefit of U.S. Provisional Patent Application Ser. No. 61/733,300, filed on Dec. 4, 2012, the disclosure of which is incorporated by reference herein in its entirety.

STATEMENT OF GOVERNMENT INTEREST

This invention was made with government support under SC0001059 awarded by the Department of Energy, FA9550-08-1-0331 awarded by the Air Force Office of Scientific Research, and DMR1121262 awarded by the National Science Foundation. The government has certain rights in the invention.

BACKGROUND

Bulk-heterojunction (BHJ) polymer solar cells (PSCs) based on interpenetrating polymer donor and fullerene acceptor networks offer a compelling approach to efficient solar energy harvesting at low costs. While PSC performance has advanced steadily, with 6-8% single junction power conversion efficiencies (PCEs) reported in the peer-reviewed literature, these metrics still lag behind those of inorganic cells. PCE ($\eta_e$) is a key index of photovoltaic device performance, and is the product of the short-circuit current ($J_{sc}$), open-circuit voltage ($V_{oc}$), and fill factor (FF), where $P_{in}$ is the incident solar power (equation 1):

$$\eta_e = \frac{V_{oc} * J_{sc} * FF}{P_{in}} \quad (1)$$

To maximize PCE, research efforts have focused on developing narrow bandgap polymers to maximize solar photon capture and increase $J_{sc}$, while lowering the polymer highest occupied molecular orbital (HOMO) to increase $V_{oc}$ and environmental stability. Nevertheless, PSC power conversion efficiencies (PCEs) are still constrained by low fill factors (FFs), typically below 70%. The realization of high FFs has proven elusive, although there is evidence that carrier mobility, active layer microstructure, and interfacial charge recombination are factors. Mobilities in turn are sensitive to the film morphology, with order typically enhancing transport. However, highly crystalline polymers can also exhibit deleterious aggregation, poor solubility, and non-optimal phase separation in PCBM blends.

Accordingly, the art desires new polymers for PSCs, particularly those that can confer a high fill factor.

SUMMARY

In light of the foregoing, the present teachings provide novel polymeric compounds that can be used as organic semiconductor materials. Also provided are associated devices and related methods for the preparation and use of these compounds. The present compounds can exhibit properties such as optimized optical absorption, good charge transport characteristics and chemical stability in ambient conditions, low-temperature processability, large solubility in common solvents, and processing versatility (e.g., via various solution processes). As a result, optoelectronic devices such as solar cells that incorporate one or more of the present compounds as a photoactive layer can exhibit high performance in ambient conditions, for example, demonstrating one or more of low band-gap, high fill factor, high open circuit voltage, and high power conversion efficiency, and preferably all of these criteria. Similarly, other organic semiconductor-based devices such as OLETs can be fabricated efficiently using the organic semiconductor materials described herein.

The present teachings also provide methods of preparing such compounds and semiconductor materials, as well as various compositions, composites, and devices that incorporate the compounds and semiconductor materials disclosed herein.

The foregoing as well as other features and advantages of the present teachings will be more fully understood from the following figures, description, examples, and claims.

BRIEF DESCRIPTION OF DRAWINGS

It should be understood that the drawings described below are for illustration purposes only. The drawings are not necessarily to scale, with emphasis generally being placed upon illustrating the principles of the present teachings. The drawings are not intended to limit the scope of the present teachings in any way.

DETAILED DESCRIPTION

Figure 1:
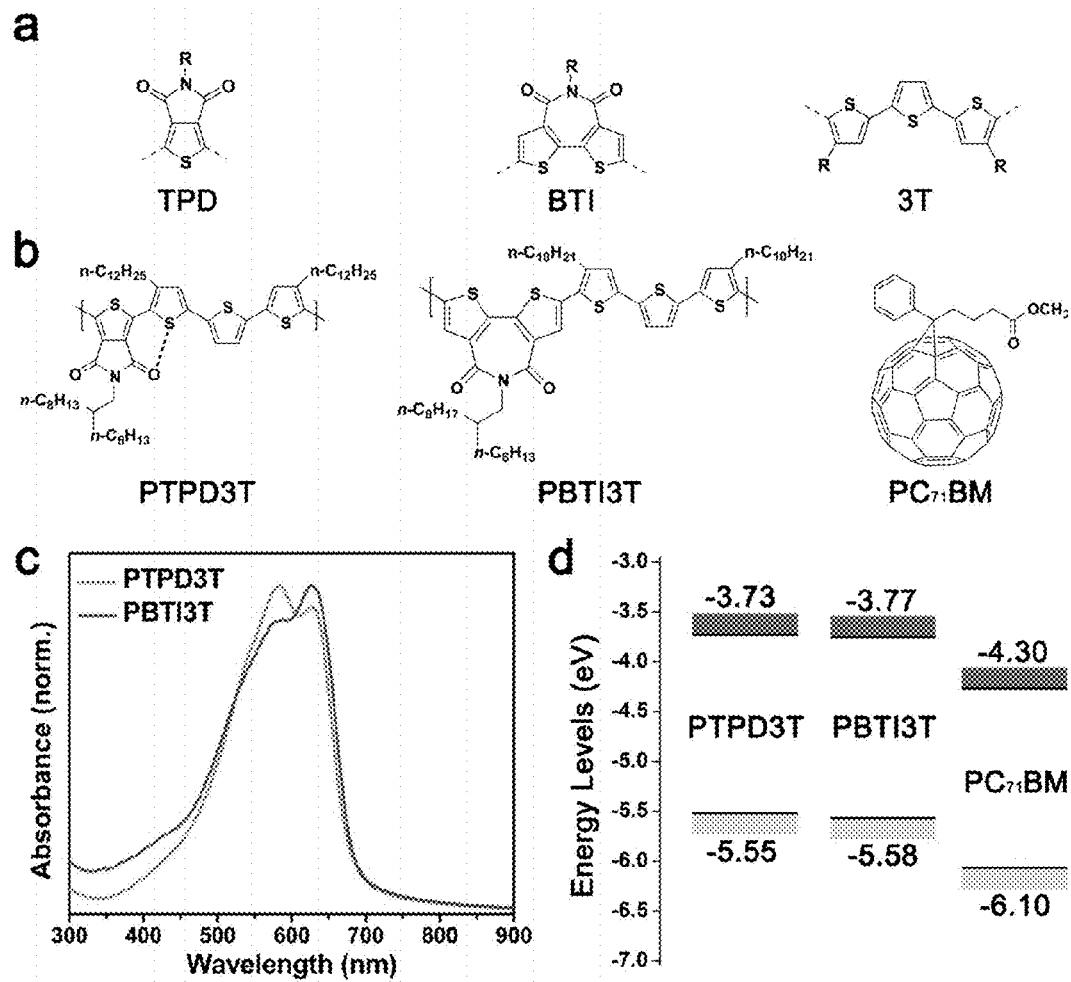
FIG. 1 shows the macromolecular building blocks, structures, optical absorption spectra, and energy levels of certain embodiments of the present polymers. a) Chemical structures of polymer building blocks thieno[3,4-c]pyrrole-4,6-dione (TPD), bithiopheneimide (BTI), and terthiophene (3T). b) Chemical structures of polymer donors P(TPD3T) and P(BTI3T) and fullerene acceptor $PC_{71}BM$. The (thienyl)S . . . O(carbonyl) interaction, indicated by the dashed line promotes P(TPD3T) backbone coplanarity and crystallinity, while greater backbone flexibility lowers the P(TPD3T) HOMO and enlarges $V_{oc}$. c) Optical absorption spectra of P(TPD3T) and P(BTI3T) pristine films spin-cast from chloroform solution (5 mg/mL). d) Energy level diagrams for P(TPD3T), P(BTI3T), and $PC_{71}BM$.

In one aspect, the present teachings provide polymeric compounds including an electron-acceptor unit (A) and an electron-donor unit (D), where the electron-acceptor unit (A) has the formula:

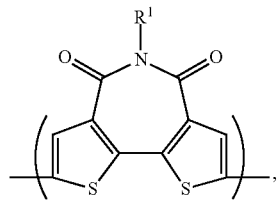

wherein R$^1$ can be selected from the group consisting of a C$_{1-40}$ alkyl group, a C$_{2-40}$ alkenyl group, and a C$_{1-40}$ haloalkyl group; and the electron-donor unit (D) can be an oligothiophene.

In another aspect, the present teachings provide polymeric compounds including an electron-acceptor unit (A) and an electron-donor unit (D), where the electron-acceptor unit (A) has the formula:

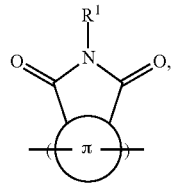

wherein π is a π-conjugated moiety comprising at least one aryl or heteroaryl group; R$^1$ can be selected from the group consisting of a C$_{1-40}$ alkyl group, a C$_{2-40}$ alkenyl group, and a C$_{1-40}$ haloalkyl group; and
the electron-donor unit (D) can comprise a terthiophene.

Compounds of the present teachings can exhibit semiconductor behavior such as optimized light absorption/charge separation in a photovoltaic device; charge transport/recombination/light emission in a light-emitting device; and/or high carrier mobility and/or good current modulation characteristics in a field-effect device. In addition, the present compounds can possess certain processing advantages such as solution-processability and/or good stability (e.g., air stability) in ambient conditions. The compounds of the present teachings can be used to prepare either p-type (donor or hole-transporting), n-type (acceptor or electron-transporting), or ambipolar semiconductor materials, which in turn can be used to fabricate various organic or hybrid optoelectronic articles, structures and devices, including organic photovoltaic devices and organic light-emitting transistors.

Throughout the application, where compositions are described as having, including, or comprising specific components, or where processes are described as having, including, or comprising specific process steps, it is contemplated that compositions of the present teachings also consist essentially of, or consist of, the recited components, and that the processes of the present teachings also consist essentially of, or consist of, the recited process steps.

In the application, where an element or component is said to be included in and/or selected from a list of recited elements or components, it should be understood that the element or component can be any one of the recited elements or components, or the element or component can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

The use of the terms "include," "includes", "including," "have," "has," or "having" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10% variation from the nominal value unless otherwise indicated or inferred.

It should be understood that the order of steps or order for performing certain actions is immaterial so long as the present teachings remain operable. Moreover, two or more steps or actions may be conducted simultaneously.

As used herein, a "p-type semiconductor material" or a "donor" material refers to a semiconductor material, for example, an organic semiconductor material, having holes as the majority current or charge carriers. In some embodiments, when a p-type semiconductor material is deposited on a substrate, it can provide a hole mobility in excess of about 10$^{-5}$ cm$^2$/Vs. In the case of field-effect devices, a p-type semiconductor also can exhibit a current on/off ratio of greater than about 10.

As used herein, an "n-type semiconductor material" or an "acceptor" material refers to a semiconductor material, for example, an organic semiconductor material, having electrons as the majority current or charge carriers. In some embodiments, when an n-type semiconductor material is deposited on a substrate, it can provide an electron mobility in excess of about 10$^{-5}$ cm$^2$/Vs. In the case of field-effect devices, an n-type semiconductor also can exhibit a current on/off ratio of greater than about 10.

As used herein, "mobility" refers to a measure of the velocity with which charge carriers, for example, holes (or units of positive charge) in the case of a p-type semiconductor material and electrons (or units of negative charge) in the case of an n-type semiconductor material, move through the material under the influence of an electric field. This parameter, which depends on the device architecture, can be measured using a field-effect device or space-charge limited current measurements.

As used herein, a compound can be considered "ambient stable" or "stable at ambient conditions" when a transistor incorporating the compound as its semiconducting material exhibits a carrier mobility that is maintained at about its initial measurement when the compound is exposed to ambient conditions, for example, air, ambient temperature, and humidity, over a period of time. For example, a compound can be described as ambient stable if a transistor incorporating the compound shows a carrier mobility that does not vary more than 20% or more than 10% from its initial value after exposure to ambient conditions, including, air, humidity and temperature, over a 3 day, 5 day, or 10 day period.

As used herein, fill factor (FF) is the ratio (given as a percentage) of the actual maximum obtainable power, ($P_m$ or $V_{mp}*J_{mp}$), to the theoretical (not actually obtainable) power, ($J_{sc}*V_{oc}$). Accordingly, FF can be determined using the equation:

$$FF=(V_{mp}*J_{mp})/(J_{sc}*V_{oc})$$

where $J_{mp}$ and $V_{mp}$ represent the current density and voltage at the maximum power point ($P_m$), respectively, this point being obtained by varying the resistance in the circuit until J*V is at its greatest value; and $J_{sc}$ and $V_{oc}$ represent the short circuit current and the open circuit voltage, respectively. Fill factor is a key parameter in evaluating the performance of solar cells. Commercial solar cells typically have a fill factor of about 0.60% or greater.

As used herein, the open-circuit voltage ($V_{oc}$) is the difference in the electrical potentials between the anode and the cathode of a device when there is no external load connected.

As used herein, the power conversion efficiency (PCE) of a solar cell is the percentage of power converted from absorbed light to electrical energy. The PCE of a solar cell can be calculated by dividing the maximum power point ($P_m$) by the input light irradiance (E, in W/m$^2$) under standard test conditions (STC) and the surface area of the solar cell ($A_c$ in m$^2$). STC typically refers to a temperature of 25° C. and an irradiance of 1000 W/m$^2$ with an air mass 1.5 (AM 1.5) spectrum.

As used herein, a component (such as a thin film layer) can be considered "photoactive" if it contains one or more compounds that can absorb photons to produce excitons for the generation of a photocurrent.

As used herein, "solution-processable" refers to compounds (e.g., polymers), materials, or compositions that can be used in various solution-phase processes including spin-coating, printing (e.g., inkjet printing, gravure printing, offset printing and the like), spray coating, electrospray coating, drop casting, dip coating, and blade coating.

As used herein, a "semicrystalline polymer" refers to a polymer that has an inherent tendency to crystallize at least partially either when cooled from a melted state or deposited from solution, when subjected to kinetically favorable conditions such as slow cooling, or low solvent evaporation rate and so forth. The crystallization or lack thereof can be readily identified by using several analytical methods, for example, differential scanning calorimetry (DSC) and/or X-ray diffraction (XRD).

As used herein, "annealing" refers to a post-deposition heat treatment to the semicrystalline polymer film in ambient or under reduced/increased pressure for a time duration of more than 100 seconds, and "annealing temperature" refers to the maximum temperature that the polymer film is exposed to for at least 60 seconds during this process of annealing. Without wishing to be bound by any particular theory, it is believed that annealing can result in an increase of crystallinity in the polymer film, where possible, thereby increasing field effect mobility. The increase in crystallinity can be monitored by several methods, for example, by comparing the differential scanning calorimetry (DSC) or X-ray diffraction (XRD) measurements of the as-deposited and the annealed films.

As used herein, a "polymeric compound" (or "polymer") refers to a molecule including a plurality of one or more repeating units connected by covalent chemical bonds. A polymeric compound can be represented by the general formula:

wherein M is the repeating unit or monomer. The polymeric compound can have only one type of repeating unit as well as two or more types of different repeating units. When a polymeric compound has only one type of repeating unit, it can be referred to as a homopolymer. When a polymeric compound has two or more types of different repeating units, the term "copolymer" or "copolymeric compound" can be used instead. For example, a copolymeric compound can include repeating units

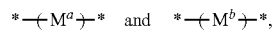

where $M^a$ and $M^b$ represent two different repeating units. Unless specified otherwise, the assembly of the repeating units in the copolymer can be head-to-tail, head-to-head, or tail-to-tail. In addition, unless specified otherwise, the copolymer can be a random copolymer, an alternating copolymer, or a block copolymer. For example, the general formula:

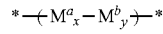

can be used to represent a copolymer of $M^a$ and $M^b$ having x mole fraction of $M^a$ and y mole fraction of $M^b$ in the copolymer, where the manner in which comonomers $M^a$ and $M^b$ is repeated can be alternating, random, regiorandom, regioregular, or in blocks. In addition to its composition, a polymeric compound can be further characterized by its degree of polymerization (n) and molar mass (e.g., number average molecular weight ($M_n$) and/or weight average molecular weight ($M_w$) depending on the measuring technique(s)).

As used herein, "halo" or "halogen" refers to fluoro, chloro, bromo, and iodo.

As used herein, "oxo" refers to a double-bonded oxygen (i.e., =O).

As used herein, "alkyl" refers to a straight-chain or branched saturated hydrocarbon group. Examples of alkyl groups include methyl (Me), ethyl (Et), propyl (e.g., n-propyl and iso-propyl), butyl (e.g., n-butyl, iso-butyl, sec-butyl, tert-butyl), pentyl groups (e.g., n-pentyl, iso-pentyl, neo-pentyl), hexyl groups, and the like. In various embodiments, an alkyl group can have 1 to 40 carbon atoms (i.e., $C_{1-40}$ alkyl group), for example, 1-20 carbon atoms (i.e., $C_{1-20}$ alkyl group). In some embodiments, an alkyl group can have 1 to 6 carbon atoms, and can be referred to as a "lower alkyl group." Examples of lower alkyl groups include methyl, ethyl, propyl (e.g., n-propyl and iso-propyl), and butyl groups (e.g., n-butyl, iso-butyl, sec-butyl, tert-butyl). In some embodiments, alkyl groups can be substituted as described herein. An alkyl group is generally not substituted with another alkyl group, an alkenyl group, or an alkynyl group.

As used herein, "haloalkyl" refers to an alkyl group having one or more halogen substituents. At various embodiments, a haloalkyl group can have 1 to 40 carbon atoms (i.e., $C_{1-40}$ haloalkyl group), for example, 1 to 20 carbon atoms (i.e., $C_{1-20}$ haloalkyl group). Examples of haloalkyl groups include $CF_3$, $C_2F_5$, $CHF_2$, $CH_2F$, $CCl_3$, $CHCl_2$, $CH_2Cl$, $C_2Cl_5$, and the like. Perhaloalkyl groups, i.e., alkyl groups where all of the hydrogen atoms are replaced with halogen atoms (e.g., $CF_3$ and $C_2F_5$), are included within the definition of "haloalkyl." For example, a $C_{1-40}$ haloalkyl group can have the formula $-C_sH_{2s+1-t}X^0{}_t$, where $X^0$, at each occurrence, is F, Cl, Br or I, s is an integer in the range of 1 to 40, and t is an integer in the range of 1 to 81, provided that t is less than or equal to 2s+1. Haloalkyl groups that are not perhaloalkyl groups can be substituted as described herein.

As used herein, "alkoxy" refers to —O-alkyl group. Examples of alkoxy groups include, but are not limited to, methoxy, ethoxy, propoxy (e.g., n-propoxy and isopropoxy), t-butoxy, pentoxyl, hexoxyl groups, and the like. The alkyl group in the —O-alkyl group can be substituted as described herein.

As used herein, "alkylthio" refers to an —S— alkyl group. Examples of alkylthio groups include, but are not limited to, methylthio, ethylthio, propylthio (e.g., n-propylthio and isopropylthio), t-butylthio, pentylthio, hexylthio groups, and the like. The alkyl group in the —S-alkyl group can be substituted as described herein.

As used herein, "alkenyl" refers to a straight-chain or branched alkyl group having one or more carbon-carbon double bonds. Examples of alkenyl groups include ethenyl, propenyl, butenyl, pentenyl, hexenyl, butadienyl, pentadienyl, hexadienyl groups, and the like. The one or more carbon-carbon double bonds can be internal (such as in 2-butene) or terminal (such as in 1-butene). In various embodiments, an alkenyl group can have 2 to 40 carbon atoms (i.e., $C_{2-40}$ alkenyl group), for example, 2 to 20 carbon atoms (i.e., $C_{2-20}$ alkenyl group). In some embodiments, alkenyl groups can be substituted as described herein. An alkenyl group is generally not substituted with another alkenyl group, an alkyl group, or an alkynyl group.

As used herein, "alkynyl" refers to a straight-chain or branched alkyl group having one or more triple carbon-carbon bonds. Examples of alkynyl groups include ethynyl, propynyl, butynyl, pentynyl, hexynyl, and the like. The one or more triple carbon-carbon bonds can be internal (such as in 2-butyne) or terminal (such as in 1-butyne). In various embodiments, an alkynyl group can have 2 to 40 carbon atoms (i.e., $C_{2-40}$ alkynyl group), for example, 2 to 20 carbon atoms (i.e., $C_{2-20}$ alkynyl group). In some embodiments, alkynyl groups can be substituted as described herein. An alkynyl group is generally not substituted with another alkynyl group, an alkyl group, or an alkenyl group.

As used herein, a "cyclic moiety" can include one or more (e.g., 1-6) carbocyclic or heterocyclic rings. The cyclic moiety can be a cycloalkyl group, a heterocycloalkyl group, an aryl group, or a heteroaryl group (i.e., can include only saturated bonds, or can include one or more unsaturated bonds regardless of aromaticity), each including, for example, 3-24 ring atoms and optionally can be substituted as described herein. In embodiments where the cyclic moiety is a "monocyclic moiety," the "monocyclic moiety" can include a 3-14 membered aromatic or non-aromatic, carbocyclic or heterocyclic ring. A monocyclic moiety can include, for example, a phenyl group or a 5- or 6-membered heteroaryl group, each of which optionally can be substituted as described herein. In embodiments where the cyclic moiety is a "polycyclic moiety," the "polycyclic moiety" can include two or more rings fused to each other (i.e., sharing a common bond) and/or connected to each other via a spiro atom, or one or more bridged atoms. A polycyclic moiety can include an 8-24 membered aromatic or non-aromatic, carbocyclic or heterocyclic ring, such as a $C_{8-24}$ aryl group or an 8-24 membered heteroaryl group, each of which optionally can be substituted as described herein.

As used herein, a "fused ring" or a "fused ring moiety" refers to a polycyclic ring system having at least two rings where at least one of the rings is aromatic and such aromatic ring (carbocyclic or heterocyclic) has a bond in common with at least one other ring that can be aromatic or non-aromatic, and carbocyclic or heterocyclic. These polycyclic ring systems can be highly π-conjugated and optionally substituted as described herein.

As used herein, "cycloalkyl" refers to a non-aromatic carbocyclic group including cyclized alkyl, alkenyl, and alkynyl groups. In various embodiments, a cycloalkyl group can have 3 to 24 carbon atoms, for example, 3 to 20 carbon atoms (e.g., $C_{3-14}$ cycloalkyl group).

A cycloalkyl group can be monocyclic (e.g., cyclohexyl) or polycyclic (e.g., containing fused, bridged, and/or spiro ring systems), where the carbon atoms are located inside or outside of the ring system. Any suitable ring position of the cycloalkyl group can be covalently linked to the defined chemical structure. Examples of cycloalkyl groups include cyclopropyl, cyclobutyl, cyclopentyl, cyclohexyl, cycloheptyl, cyclopentenyl, cyclohexenyl, cyclohexadienyl, cycloheptatrienyl, norbornyl, norpinyl, norcaryl, adamantyl, and spiro[4.5]decanyl groups, as well as their homologs, isomers, and the like. In some embodiments, cycloalkyl groups can be substituted as described herein.

As used herein, "heteroatom" refers to an atom of any element other than carbon or hydrogen and includes, for example, nitrogen, oxygen, silicon, sulfur, phosphorus, and selenium.

As used herein, "cycloheteroalkyl" refers to a non-aromatic cycloalkyl group that contains at least one ring heteroatom selected from O, S, Se, N, P, and Si (e.g., O, S, and N), and optionally contains one or more double or triple bonds. A cycloheteroalkyl group can have 3 to 24 ring atoms, for example, 3 to 20 ring atoms (e.g., 3-14 membered cycloheteroalkyl group). One or more N, P, S, or Se atoms (e.g., N or S) in a cycloheteroalkyl ring may be oxidized (e.g., morpholine N-oxide, thiomorpholine S-oxide, thiomorpholine S,S-dioxide). In some embodiments, nitrogen or phosphorus atoms of cycloheteroalkyl groups can bear a substituent, for example, a hydrogen atom, an alkyl group, or other substituents as described herein. Cycloheteroalkyl groups can also contain one or more oxo groups, such as oxopiperidyl, oxooxazolidyl, dioxo-(1H,3H)-pyrimidyl, oxo-2(1H)-pyridyl, and the like. Examples of cycloheteroalkyl groups include, among others, morpholinyl, thiomorpholinyl, pyranyl, imidazolidinyl, imidazolinyl, oxazolidinyl, pyrazolidinyl, pyrazolinyl, pyrrolidinyl, pyrrolinyl, tetrahydrofuranyl, tetrahydrothiophenyl, piperidinyl, piperazinyl, and the like. In some embodiments, cycloheteroalkyl groups can be substituted as described herein.

As used herein, "aryl" refers to an aromatic monocyclic hydrocarbon ring system or a polycyclic ring system in which two or more aromatic hydrocarbon rings are fused (i.e., having a bond in common with) together or at least one aromatic monocyclic hydrocarbon ring is fused to one or more cycloalkyl and/or cycloheteroalkyl rings. An aryl group can have 6 to 24 carbon atoms in its ring system (e.g., $C_{6-20}$ aryl group), which can include multiple fused rings. In some embodiments, a polycyclic aryl group can have 8 to 24 carbon atoms. Any suitable ring position of the aryl group can be covalently linked to the defined chemical structure. Examples of aryl groups having only aromatic carbocyclic ring(s) include phenyl, 1-naphthyl(bicyclic), 2-naphthyl(bicyclic), anthracenyl(tricyclic), phenanthrenyl(tricyclic), pentacenyl(pentacyclic), and like groups. Examples of polycyclic ring systems in which at least one aromatic carbocyclic ring is fused to one or more cycloalkyl and/or cycloheteroalkyl rings include, among others, benzo derivatives of cyclopentane (i.e., an indanyl group, which is a 5,6-bicyclic cycloalkyl/aromatic ring system), cyclohexane (i.e., a tetrahydronaphthyl group, which is a 6,6-bicyclic cycloalkyl/aromatic ring system), imidazoline (i.e., a benz-imidazolinyl group, which is a 5,6-bicyclic cycloheteroalkyl/aromatic ring system), and pyran (i.e., a chromenyl group, which is a 6,6-bicyclic cycloheteroalkyl/aromatic ring system). Other examples of aryl groups include benzodioxanyl, benzodioxolyl, chromanyl, indolinyl groups, and the like. In some embodiments, aryl groups can be substituted as described herein. In some embodiments, an aryl group can have one or more halogen substituents, and can be referred to as a "haloaryl" group. Perhaloaryl groups, i.e., aryl groups where all of the hydrogen atoms are replaced with halogen atoms (e.g., —$C_6F_5$), are included within the definition of "haloaryl." In certain embodiments, an aryl group is substituted with another aryl group and can be referred to as a biaryl group. Each of the aryl groups in the biaryl group can be substituted as disclosed herein.

As used herein, "arylalkyl" refers to an -alkyl-aryl group, where the arylalkyl group is covalently linked to the defined chemical structure via the alkyl group. An arylalkyl group is within the definition of a —Y—$C_{6-14}$ aryl group, where Y is as defined herein. An example of an arylalkyl group is a benzyl group (—$CH_2$—$C_6H_5$). An arylalkyl group can be optionally substituted, i.e., the aryl group and/or the alkyl group, can be substituted as disclosed herein.

As used herein, "heteroaryl" refers to an aromatic monocyclic ring system containing at least one ring heteroatom selected from oxygen (O), nitrogen (N), sulfur (S), silicon (Si), and selenium (Se) or a polycyclic ring system where at least one of the rings present in the ring system is aromatic and contains at least one ring heteroatom. Polycyclic heteroaryl groups include those having two or more heteroaryl rings fused together, as well as those having at least one monocyclic heteroaryl ring fused to one or more aromatic carbocyclic rings, non-aromatic carbocyclic rings, and/or non-aromatic cycloheteroalkyl rings. A heteroaryl group, as a whole, can have, for example, 5 to 24 ring atoms and contain 1-5 ring heteroatoms (i.e., 5-20 membered heteroaryl group). The heteroaryl group can be attached to the defined chemical structure at any heteroatom or carbon atom that results in a stable structure. Generally, heteroaryl rings do not contain O—O, S—S, or S—O bonds. However, one or more N or S atoms in a heteroaryl group can be oxidized (e.g., pyridine N-oxide, thiophene S-oxide, thiophene S,S-dioxide). Examples of heteroaryl groups include, for example, the 5- or 6-membered monocyclic and 5-6 bicyclic ring systems shown below:

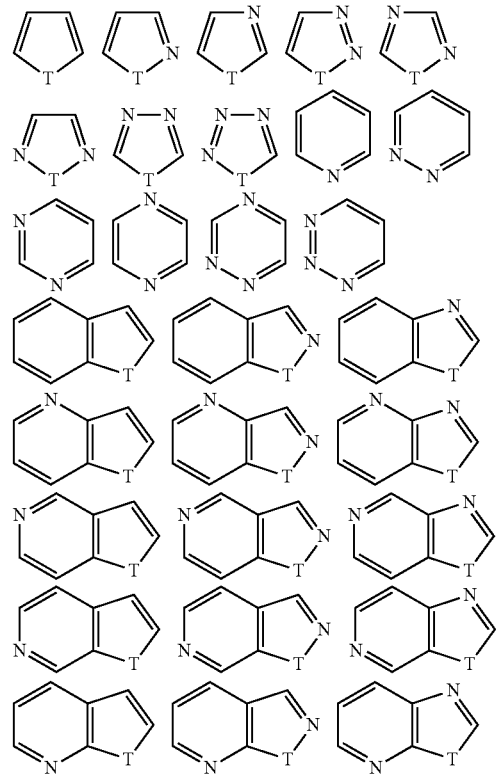

where T is O, S, NH, N-alkyl, N-aryl, N-(arylalkyl) (e.g., N-benzyl), $SiH_2$, SiH(alkyl), Si(alkyl)$_2$, SiH(arylalkyl), Si(arylalkyl)$_2$, or Si(alkyl)(arylalkyl). Examples of such heteroaryl rings include pyrrolyl, furyl, thienyl, pyridyl, pyrimidyl, pyridazinyl, pyrazinyl, triazolyl, tetrazolyl, pyrazolyl, imidazolyl, isothiazolyl, thiazolyl, thiadiazolyl, isoxazolyl, oxazolyl, oxadiazolyl, indolyl, isoindolyl, benzofuryl, benzothienyl, quinolyl, 2-methylquinolyl, isoquinolyl, quinoxalyl, quinazolyl, benzotriazolyl, benzimidazolyl, benzothiazolyl, benzisothiazolyl, benzisoxazolyl, benzoxadiazolyl, benzoxazolyl, cinnolinyl, 1H-indazolyl, 2H-indazolyl, indolizinyl, isobenzofuyl, naphthyridinyl, phthalazinyl, pteridinyl, purinyl, oxazolopyridinyl, thiazolopyridinyl, imidazopyridinyl, furopyridinyl, thienopyridinyl, pyridopyrimidinyl, pyridopyrazinyl, pyridopyridazinyl, thienothiazolyl, thienoxazolyl, thienoimidazolyl groups, and the like. Further examples of heteroaryl groups include 4,5,6,7-tetrahydroindolyl, tetrahydroquinolinyl, benzothienopyridinyl, benzofuropyridinyl groups, and the like. In some embodiments, heteroaryl groups can be substituted as described herein.

Compounds of the present teachings can include a "divalent group" defined herein as a linking group capable of forming a covalent bond with two other moieties. For example, compounds of the present teachings can include a divalent $C_{1-20}$ alkyl group (e.g., a methylene group), a divalent $C_{2-20}$ alkenyl group (e.g., a vinylyl group), a divalent $C_{2-20}$ alkynyl group (e.g., an ethynylyl group). a divalent $C_{6-14}$ aryl group (e.g., a phenylyl group); a divalent 3-14 membered cycloheteroalkyl group (e.g., a pyrrolidylyl), and/or a divalent 5-14 membered heteroaryl group (e.g., a thienylyl group). Generally, a chemical group (e.g., —Ar—)

is understood to be divalent by the inclusion of the two bonds before and after the group.

The electron-donating or electron-withdrawing properties of several hundred of the most common substituents, reflecting all common classes of substituents have been determined, quantified, and published. The most common quantification of electron-donating and electron-withdrawing properties is in terms of Hammett σ values. Hydrogen has a Hammett σ value of zero, while other substituents have Hammett σ values that increase positively or negatively in direct relation to their electron-withdrawing or electron-donating characteristics. Substituents with negative Hammett σ values are considered electron-donating, while those with positive Hammett σ values are considered electron-withdrawing. See Lange's Handbook of Chemistry, 12th ed., McGraw Hill, 1979, Table 3-12, pp. 3-134 to 3-138, which lists Hammett σ values for a large number of commonly encountered substituents and is incorporated by reference herein.

It should be understood that the term "electron-accepting group" can be used synonymously herein with "electron acceptor" and "electron-withdrawing group". In particular, an "electron-withdrawing group" ("EWG") or an "electron-accepting group" or an "electron-acceptor" refers to a functional group that draws electrons to itself more than a hydrogen atom would if it occupied the same position in a molecule. Examples of electron-withdrawing groups include, but are not limited to, halogen or halo (e.g., F, Cl, Br, I), —$NO_2$, —CN, —NC, —$S(R^O)_2{}^+$, —$N(R^O)_3{}^+$, —$SO_3H$, —$SO_2R^O$, —$SO_3R^O$, —$SO_2NHR^O$, —$SO_2N(R^O)_2$, —COOH, —$COR^O$, —$COOR^O$, —$CONHR^O$, —$CON(R^O)_2$, $C_{1-40}$ haloalkyl groups, $C_{6-14}$ aryl groups, and 5-14 membered electron-poor heteroaryl groups; where $R^O$ is a $C_{1-20}$ alkyl group, a $C_{2-20}$ alkenyl group, a $C_{2-20}$ alkynyl group, a $C_{1-20}$ haloalkyl group, a $C_{1-20}$ alkoxy group, a $C_{6-14}$ aryl group, a $C_{3-14}$ cycloalkyl group, a 3-14 membered cycloheteroalkyl group, and a 5-14 membered heteroaryl group, each of which can be optionally substituted as described herein. For example, each of the $C_{1-20}$ alkyl group, the $C_{2-20}$ alkenyl group, the $C_{2-20}$ alkynyl group, the $C_{1-20}$ haloalkyl group, the $C_{1-20}$ alkoxy group, the $C_{6-14}$ aryl group, the $C_{3-14}$ cycloalkyl group, the 3-14 membered cycloheteroalkyl group, and the 5-14 membered heteroaryl group can be optionally substituted with 1-5 small electron-withdrawing groups such as F, Cl, Br, —$NO_2$, —CN, —NC, —$S(R^O)_2{}^+$, —$N(R^O)_3{}^+$, —$SO_3H$, —$SO_2R^O$, —$SO_3R^O$, —$SO_2NHR^O$, —$SO_2N(R^O)_2$, —COOH, —$COR^O$, —$COOR^O$, —$CONHR^O$, and —$CON(R^O)_2$.

It should be understood that the term "electron-donating group" can be used synonymously herein with "electron donor". In particular, an "electron-donating group" or an "electron-donor" refers to a functional group that donates electrons to a neighboring atom more than a hydrogen atom would if it occupied the same position in a molecule. Examples of electron-donating groups include —OH, —$OR^O$, —$NH_2$, —$NHR^O$, —$N(R^O)_2$, and 5-14 membered electron-rich heteroaryl groups, where $R^O$ is a $C_{1-20}$ alkyl group, a $C_{2-20}$ alkenyl group, a $C_{2-20}$ alkynyl group, a $C_{6-14}$ aryl group, or a $C_{3-14}$ cycloalkyl group.

Various unsubstituted heteroaryl groups can be described as electron-rich (or π-excessive) or electron-poor (or π-deficient). Such classification is based on the average electron density on each ring atom as compared to that of a carbon atom in benzene. Examples of electron-rich systems include 5-membered heteroaryl groups having one heteroatom such as furan, pyrrole, and thiophene; and their benzofused counterparts such as benzofuran, benzopyrrole, and benzothiophene. Examples of electron-poor systems include 6-membered heteroaryl groups having one or more heteroatoms such as pyridine, pyrazine, pyridazine, and pyrimidine; as well as their benzofused counterparts such as quinoline, isoquinoline, quinoxaline, cinnoline, phthalazine, naphthyridine, quinazoline, phenanthridine, acridine, and purine. Mixed heteroaromatic rings can belong to either class depending on the type, number, and position of the one or more heteroatom(s) in the ring. See Katritzky, A. R and Lagowski, J. M., *Heterocyclic Chemistry* (John Wiley & Sons, New York, 1960).

At various places in the present specification, substituents are disclosed in groups or in ranges. It is specifically intended that the description include each and every individual subcombination of the members of such groups and ranges. For example, the term "$C_{1-6}$ alkyl" is specifically intended to individually disclose $C_1$, $C_2$, $C_3$, $C_4$, $C_5$, $C_6$, $C_1$-$C_6$, $C_1$-$C_5$, $C_1$-$C_4$, $C_1$-$C_3$, $C_1$-$C_2$, $C_2$-$C_6$, $C_2$-$C_5$, $C_2$-$C_4$, $C_2$-$C_3$, $C_3$-$C_6$, $C_3$-$C_5$, $C_3$-$C_4$, $C_4$-$C_6$, $C_4$-$C_5$, and $C_5$-$C_6$ alkyl. By way of other examples, an integer in the range of 0 to 40 is specifically intended to individually disclose 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, and 40, and an integer in the range of 1 to 20 is specifically intended to individually disclose 1, 2, 3, 4, 5, 6, 7, 8, 9, 10, 11, 12, 13, 14, 15, 16, 17, 18, 19, and 20. Additional examples include that the phrase "optionally substituted with 1-5 substituents" is specifically intended to individually disclose a chemical group that can include 0, 1, 2, 3, 4, 5, 0-5, 0-4, 0-3, 0-2, 0-1, 1-5, 1-4, 1-3, 1-2, 2-5, 2-4, 2-3, 3-5, 3-4, and 4-5 substituents.

Compounds described herein can contain an asymmetric atom (also referred as a chiral center) and some of the compounds can contain two or more asymmetric atoms or centers, which can thus give rise to optical isomers (enantiomers) and geometric isomers (diastereomers). The present teachings include such optical and geometric isomers, including their respective resolved enantiomerically or diastereomerically pure isomers (e.g., (+) or (−) stereoisomer) and their racemic mixtures, as well as other mixtures of the enantiomers and diastereomers. In some embodiments, optical isomers can be obtained in enantiomerically enriched or pure form by standard procedures known to those skilled in the art, which include, for example, chiral separation, diastereomeric salt formation, kinetic resolution, and asymmetric synthesis. The present teachings also encompass cis- and trans-isomers of compounds containing alkenyl moieties (e.g., alkenes, azo, and imines). It also should be understood that the compounds of the present teachings encompass all possible regioisomers in pure form and mixtures thereof. In some embodiments, the preparation of the present compounds can include separating such isomers using standard separation procedures known to those skilled in the art, for example, by using one or more of column chromatography, thin-layer chromatography, simulated moving-bed chromatography, and high-performance liquid chromatography. However, mixtures of regioisomers can be used similarly to the uses of each individual regioisomer of the present teachings as described herein and/or known by a skilled artisan.

It is specifically contemplated that the depiction of one regioisomer includes any other regioisomers and any regioisomeric mixtures unless specifically stated otherwise.

As used herein, a "leaving group" ("LG") refers to a charged or uncharged atom (or group of atoms) that can be displaced as a stable species as a result of, for example, a substitution or elimination reaction. Examples of leaving groups include, but are not limited to, halogen (e.g., Cl, Br, I), azide ($N_3$), thiocyanate (SCN), nitro ($NO_2$), cyanate (CN), water ($H_2O$), ammonia ($NH_3$), and sulfonate groups (e.g., $OSO_2$—R, wherein R can be a $C_{1-10}$ alkyl group or a $C_{6-14}$ aryl group each optionally substituted with 1-4 groups independently selected from a $C_{1-10}$ alkyl group and an electron-withdrawing group) such as tosylate (toluenesulfonate, OTs), mesylate (methanesulfonate, OMs), brosylate (p-bromobenzenesulfonate, OBs), nosylate (4-nitrobenzenesulfonate, ONs), and triflate (trifluoromethanesulfonate, OTf).

Throughout the specification, structures may or may not be presented with chemical names. Where any question arises as to nomenclature, the structure prevails.

The present teachings relate to polymeric compounds that can be used as organic semiconductor materials. The present compounds can have good solubility in various common solvents and good stability in air. When incorporated into optical or optoelectronic devices including, but not limited to, photovoltaic or solar cells, light emitting diodes, and light emitting transistors, the present compounds can confer various desirable performance properties. For example, when the present compounds are used in a photoactive layer of a solar cell (e.g., bulk heterojunction devices), the solar cell can exhibit a high fill factor (e.g., higher than about 50%, preferably higher than about 60%, and more preferably higher than about 70%) and in turn a high power conversion efficiency (e.g., about 3.0% or greater, preferably about 6.0% or greater, more preferably about 7.0% or greater, and most preferably about 8.0% or greater).

In one aspect, the present teachings provide polymeric compounds (or polymers) having an electron-acceptor unit (A) and an electron-donor unit (D), wherein the electron-acceptor unit (A) has a bithiopheneimide (BTI) moiety represented by the formula:

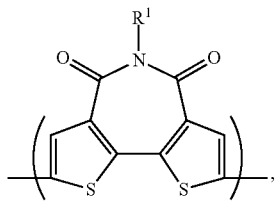

wherein $R^1$ is selected from the group consisting of a $C_{1-40}$ alkyl group, a $C_{2-40}$ alkenyl group, and a $C_{1-40}$ haloalkyl group; and
the electron-donor unit (D) is an oligothiophene.

While certain bithiopheneimide-based polymers have been reported in the literature, the inventors unexpectedly have discovered that copolymerizing a bithiopheneimide (BTI) moiety with an oligothiophene moiety (e.g., a terthiophene (T3) moiety, a quaterthiophene (T4) moiety, a quinquethiophene (T5) moiety, and a sexithiophene (T6) moiety) can lead to polymers with substantially increased fill factor and in turn, improved solar cell power conversion efficiencies (PCEs). In particular, as demonstrated by Example 8, comparing to copolymers of a bithiopheneimide (BTI) moiety and a bithiophene (T2) moiety (BTI-T2 copolymers), which exhibited a PCE of about 2% or less, copolymers of a bithiopheneimide (BTI) moiety and a quaterthiophene (T4) moiety (BTI-T4 copolymers) were able to achieve a PCE of about 3% or higher. Even more unexpectedly, copolymers of a bithiopheneimide (BTI) moiety and a terthiophene (T3)

moiety (BTI-T3 copolymers) exhibited a PCE of about 7% or higher, with some formulations achieving a PCE of about 8% or higher.

Accordingly, in some embodiments, the present polymeric compounds can have an electron-acceptor unit (A) including a bithiopheneimide (BTI) moiety and an electron-donor unit (D) comprising between 3 and 10 optionally substituted thienyl moieties. For example, the electron-donor unit (D) can have the formula:

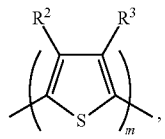

wherein:
$R^2$ and $R^3$, at each occurrence, independently can be H or $R^4$, wherein $R^4$, at each occurrence, independently can be selected from the group consisting of a -L-$C_{1-40}$ alkyl group, a -L-$C_{2-40}$ alkenyl group, and a -L-$C_{1-40}$ haloalkyl group, wherein L, at each occurrence, can be selected from the group consisting of O, S, and a covalent bond, and each of the $C_{1-40}$ alkyl group and the $C_{2-40}$ alkenyl group optionally can be substituted with 1-10 substituents independently selected from the group consisting of a halogen, —CN, —$NH_2$, —NH($C_{1-20}$ alkyl), —N($C_{1-20}$ alkyl)$_2$, —$SiH_3$, —SiH($C_{1-20}$ alkyl)$_2$, —$SiH_2$($C_{1-20}$ alkyl), —Si($C_{1-20}$ alkyl)$_3$, an —O—$C_{1-20}$ alkyl group, and an —S—$C_{1-20}$ alkyl group; and m can be selected from the group consisting of 3, 4, 5, 6, 7, and 8.

In certain embodiments, the present polymeric compounds can have an electron-acceptor unit (A) including a bithiopheneimide (BTI) moiety and an electron-donor unit (D) comprising between 3 and 5 optionally substituted thienyl moieties. More specifically, the electron-donor unit (D) can have the formula:

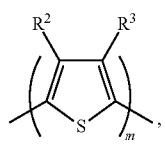

wherein m can be 3, 4 or 5, and $R^2$ and $R^3$ are as defined herein. For example, in certain embodiments, each of $R^2$ and $R^3$ can be H; while in certain embodiments, at least one of the $R^2$ groups and/or at least one of the $R^3$ groups can be $R^4$, wherein $R^4$ is as defined herein.

To illustrate, in certain embodiments, the electron-donor unit (D) of the present polymers can comprise a terthiophene, where optionally the terthiophene can be selected from the group consisting of:

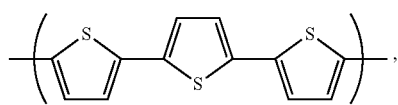

-continued

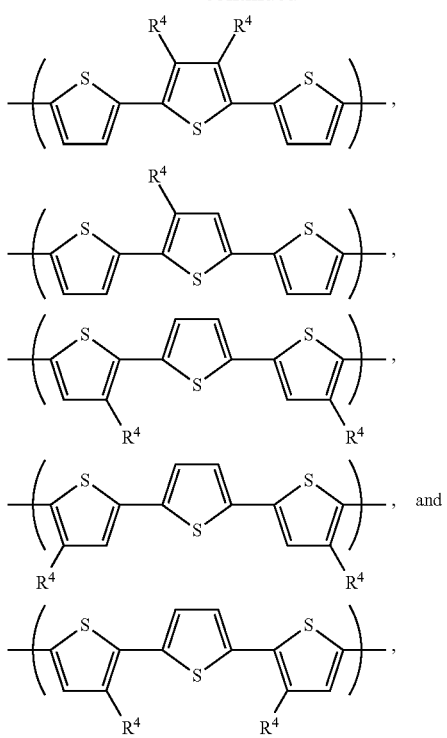

wherein R⁴, at each occurrence, independently can be selected from the group consisting of a -L-C$_{6-40}$ alkyl group, a -L-C$_{6-40}$ alkenyl group, and a -L-C$_{6-40}$ haloalkyl group, wherein L, at each occurrence, can be selected from the group consisting of O, S, and a covalent bond.

To illustrate, in certain embodiments, the electron-donor unit (D) of the present polymers can comprise a quaterthiophene, where optionally the quaterthiophene can be selected from the group consisting of:

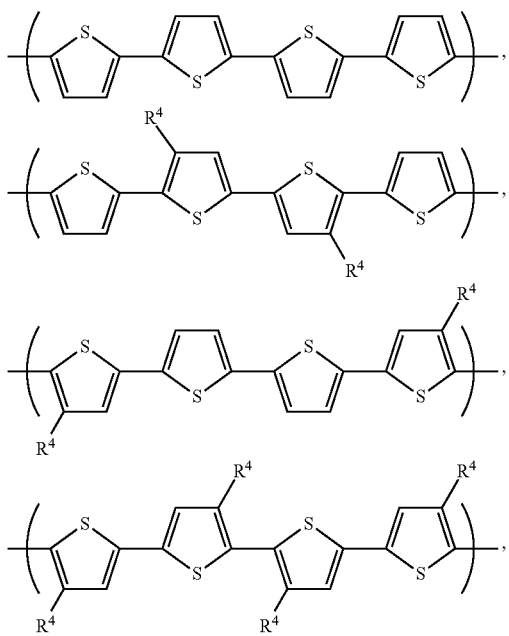

-continued

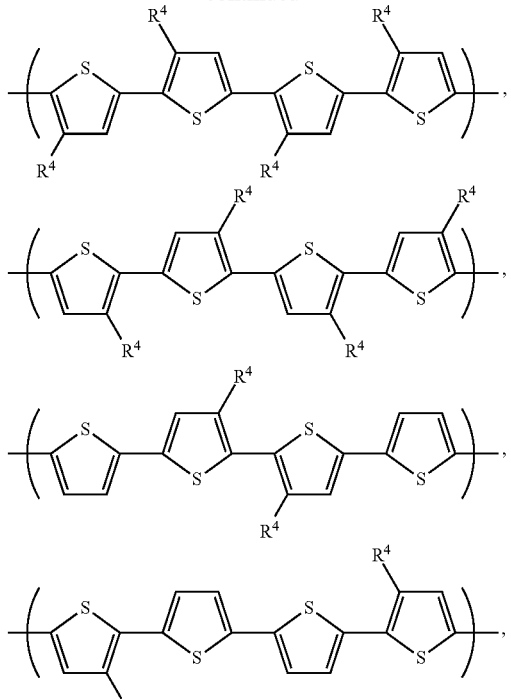

wherein R⁴, at each occurrence, independently can be selected from the group consisting of a -L-C$_{6-40}$ alkyl group, a -L-C$_{6-40}$ alkenyl group, and a -L-C$_{6-40}$ haloalkyl group, wherein L, at each occurrence, can be selected from the group consisting of O, S, and a covalent bond.

In various embodiments, the electron-donor unit (D) and the BTI-containing electron-acceptor unit (A) described herein together can comprise an alternating repeat unit of the formula:

thereby providing an alternating copolymer consisting of a BTI-containing electron-acceptor unit (A) and an oligothiophene-containing electron-donor unit (D). In various embodiments, the present copolymer can have a molecular weight in the range of about 3,000 to about 300,000 g/mol.

In preferred embodiments, the present copolymer can be represented by the formula:

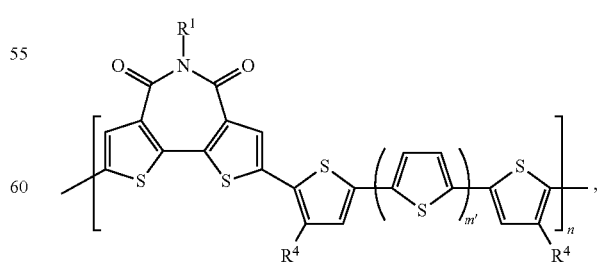

wherein the degree of polymerization (n) can range between 3 and 1000, preferably between 10 and 1000, and more preferably between 20 and 1000; m' can be 1, 2 or 3; and R¹ and R⁴ are as defined herein. For example, R¹ can be selected from the group consisting of a branched $C_{3-40}$ alkyl group, a branched $C_{4-40}$ alkenyl group, and a branched $C_{3-40}$ haloalkyl group; and R⁴ can be an -L-$C_{6-40}$ alkyl group, wherein L can be O or a covalent bond.

Without wishing to be bound by any particular theory, it is believed that copolymerizing an oligothiophene-containing unit, in particular, a terthiophene (T3) moiety, with other imide-functionalized arene moieties can lead to polymers with substantially increased solar cell PCEs as demonstrated with BTI-T3 copolymers. Imide-functionalized arenes have various characteristics that make them attractive solar cell polymer electron-acceptor units. For example, their compatibility with solubilizing substituents, electron-deficient characteristics, and structure-enforcing geometries can integrate synergistically desirable optoelectronic properties into a single macromolecular architecture. First, the strong imide group electron-withdrawing capacity can enable tuning of the copolymer bandgap and frontier molecular orbital (FMO) energies, which are of primary concern for optimizing solar cell performance. Second, π-conjugated (macro) molecules typically can be synthesized using Pd-mediated coupling reactions, and the dibrominated imide monomer electron deficiency favors efficient Pd(0) catalyst C—Br oxidative addition and subsequent coupling with electron-rich comonomers to yield high molecular weight copolymers, which is desirable for PSC performance. Third, facile imide backbone N-alkylation can enable manipulation of polymer solubility and solid-state packing without disrupting close π-π stacking required for efficient carrier transport, and intermolecular donor-acceptor interactions can promote close intermolecular π-orbital overlap. Furthermore, the solubilizing/crystallizing tendencies of imide N-substituents should facilitate fine-tuning of materials structural organization to optimize PSC performance.

Accordingly, in another aspect, the present teachings provide polymeric compounds (or polymers) having an electron-acceptor unit (A) and an electron-donor unit (D), wherein the electron-acceptor unit (A) has an imide-functionalized arene moiety represented by the formula:

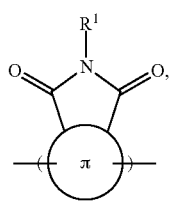

wherein:
π is a π-conjugated moiety comprising at least one aryl or heteroaryl group;
R¹ is selected from the group consisting of a $C_{1-40}$ alkyl group, a $C_{2-40}$ alkenyl group, and a $C_{1-40}$ haloalkyl group; and
the electron-donor unit (D) comprises a terthiophene.

More specifically, the imide-functionalized arene moiety can be selected from the group consisting of:

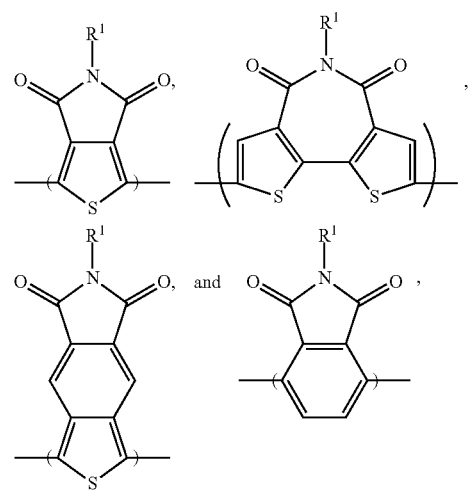

wherein R¹ can be selected from a $C_{1-40}$ alkyl group, a $C_{2-40}$ alkenyl group, and a $C_{1-40}$ haloalkyl group.

The terthiophene-containing electron-donor unit (D) can be represented by the formula:

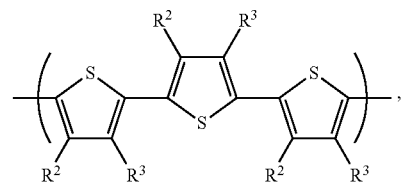

wherein R² and R³, at each occurrence, independently can be H or R⁴, wherein R⁴, at each occurrence, independently can be selected from the group consisting of a -L-$C_{1-40}$ alkyl group, a -L-$C_{2-40}$ alkenyl group, and a -L-$C_{1-40}$ haloalkyl group, wherein L, at each occurrence, can be selected from the group consisting of O, S, and a covalent bond, and each of the $C_{1-40}$ alkyl group and the $C_{2-40}$ alkenyl group optionally can be substituted with 1-10 substituents independently selected from the group consisting of a halogen, —CN, —NH₂, —NH($C_{1-20}$ alkyl), —N($C_{1-20}$ alkyl)₂, —SiH₃, —SiH($C_{1-20}$ alkyl)₂, —SiH₂($C_{1-20}$ alkyl), —Si($C_{1-20}$ alkyl)₃, an —O—$C_{1-20}$ alkyl group, and an —S—$C_{1-20}$ alkyl group.

In particular embodiments, the terthiophene-containing electron-donor unit (D) can be represented by the formula:

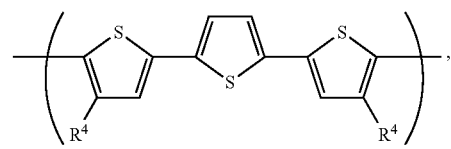

wherein R⁴ is as defined herein.

The present teachings, therefore, can encompass various alternating copolymers consisting of an imide-functionalized arene electron-acceptor unit (A) and a terthiophene-containing electron-donor unit (D) such as:

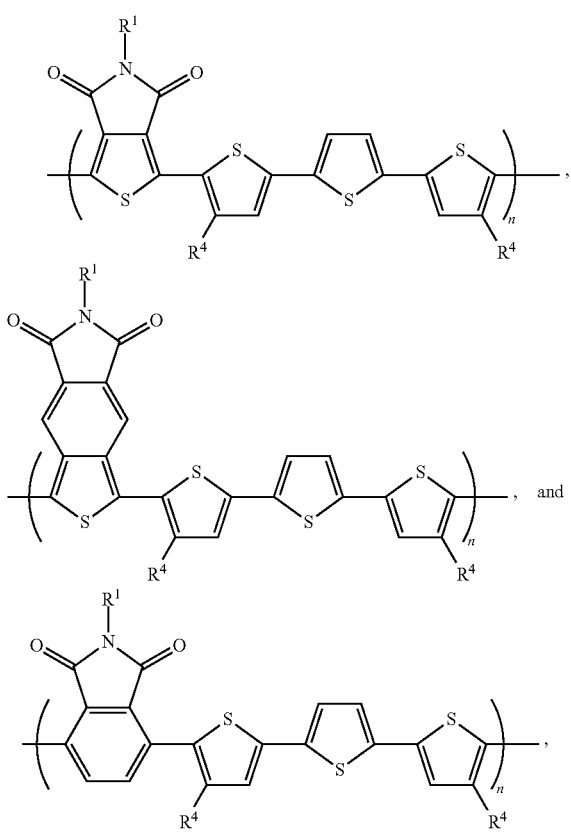

wherein the degree of polymerization (n) can range between 3 and 100, preferably between 10 and 100, and more preferably between 20 and 100; and $R^1$ and $R^4$ are as defined herein. For example, $R^1$ can be selected from the group consisting of a branched $C_{3-40}$ alkyl group, a branched $C_{4-40}$ alkenyl group, and a branched $C_{3-40}$ haloalkyl group; and $R^4$ can be an -L-$C_{6-40}$ alkyl group, wherein L can be 0 or a covalent bond. Copolymers according to these embodiments can have substantially increased PCEs compared to analogous copolymers having an electron-donor unit (D) that is a monothiophene moiety, a bithiophene moiety or a quaterthiophene moiety. See *J. Mater. Chem.*, 19: 5303-5310 (2009); *Adv. Energy Mater.*, 2: 575-582 (2012); *Eur. Polym. J.*, 48: 532-540 (2012); *J. Mater. Chem.*, 21: 12454-12461 (2011); *Adv. Mater.*, 23: 3315-3319 (2011); *Adv. Energy Mater.*, DOI: 10.1002/aenm.201200350 (2012); and *Macromolecules*, 44: 269-277 (2011).

Polymers of the present teachings and monomers leading to the present polymers can be prepared according to procedures analogous to those described in the Examples. In particular, Stille coupling or Suzuki coupling reactions can be used to prepare polymers according to the present teachings with high molecular weights and in high yields and purity, as confirmed by $^1$H NMR spectra, elemental analysis, and/or GPC measurements.

Alternatively, the present polymeric compounds can be prepared from commercially available starting materials, compounds known in the literature, or via other readily prepared intermediates, by employing standard synthetic methods and procedures known to those skilled in the art. Standard synthetic methods and procedures for the preparation of organic molecules and functional group transformations and manipulations can be readily obtained from the relevant scientific literature or from standard textbooks in the field. It will be appreciated that where typical or preferred process conditions (i.e., reaction temperatures, times, mole ratios of reactants, solvents, pressures, etc.) are given, other process conditions can also be used unless otherwise stated. Optimum reaction conditions can vary with the particular reactants or solvent used, but such conditions can be determined by one skilled in the art by routine optimization procedures. Those skilled in the art of organic synthesis will recognize that the nature and order of the synthetic steps presented can be varied for the purpose of optimizing the formation of the compounds described herein.

The processes described herein can be monitored according to any suitable method known in the art. For example, product formation can be monitored by spectroscopic means, such as nuclear magnetic resonance spectroscopy (NMR, e.g., $^1$H or $^{13}$C), infrared spectroscopy (IR), optical absorption/emission spectroscopy (e.g., UV-visible), mass spectrometry (MS), or by chromatography such as high pressure liquid chromatography (HPLC), gas chromatography (GC), gel-permeation chromatography (GPC), or thin layer chromatography (TLC).

The reactions or the processes described herein can be carried out in suitable solvents which can be readily selected by one skilled in the art of organic synthesis. Suitable solvents typically are substantially nonreactive with the reactants, intermediates, and/or products at the temperatures at which the reactions are carried out, i.e., temperatures that can range from the solvent's freezing temperature to the solvent's boiling temperature. A given reaction can be carried out in one solvent or a mixture of more than one solvent. Depending on the particular reaction step, suitable solvents for a particular reaction step can be selected.

Polymers disclosed herein can be soluble in various common organic solvents. As used herein, a polymer can be considered soluble in a solvent when at least 0.1 mg of the polymer can be dissolved in 1 mL of the solvent. Examples of common organic solvents include petroleum ethers; acetonitrile; aromatic hydrocarbons such as benzene, toluene, xylene, and mesitylene; ketones such as acetone, and methyl ethyl ketone; ethers such as tetrahydrofuran, dioxane, bis(2-methoxyethyl) ether, diethyl ether, di-isopropyl ether, and t-butyl methyl ether; alcohols such as methanol, ethanol, butanol, and isopropyl alcohol; aliphatic hydrocarbons such as hexanes; esters such as methyl acetate, ethyl acetate, methyl formate, ethyl formate, isopropyl acetate, and butyl acetate; amides such as dimethylformamide and dimethylacetamide; sulfoxides such as dimethylsulfoxide; halogenated aliphatic and aromatic hydrocarbons such as dichloromethane, chloroform, ethylene chloride, chlorobenzene, dichlorobenzene, and trichlorobenzene; and cyclic solvents such as cyclopentanone, cyclohexanone, and 2-methypyrrolidone.

The polymers described herein can be dissolved, dispersed or suspended in a single solvent or mixture of solvents to provide a composition suitable for solution processing techniques. In preferred embodiments, the solvent can be selected from the group consisting of chlorobenzene, dichlorobenzene (o-dichlorobenzene, m-dichlorobenzene, p-orobenzene, or mixtures thereof), trichlorobenzene, benzene, toluene, chloroform, dichloromethane, dichloroethane, xylenes, α,α,α-trichlorotoluene, methyl naphthalene (e.g., 1-methylnaphthalene, 2-methylnaphthalene, or mixtures thereof), chloronaphthalene (e.g., 1-chloronaphthalene, 2-chloronaphthalene, or mixtures thereof), and mixtures thereof. Various solution processing techniques have been used with organic electronics. Common solution processing techniques include, for example, spin coating, slot coating, doctor blading, zone casting, drop-casting, dip coating, blade coating, or spraying. Another example of solution processing technique is printing. As used herein, "printing" includes a noncontact process such as inkjet printing, microdispensing and the like, and a contact process such as screen-printing, gravure printing, offset printing, flexographic printing, lithographic printing, pad printing, microcontact printing and the like.

Polymers of the present teachings can exhibit semiconductor behavior (including photoactive behavior) such as optimized light absorption/charge separation in a photovoltaic device; charge transport/recombination/light emission in a light-emitting device; and/or high carrier mobility and/or good current modulation characteristics in a field-effect device. In addition, the present polymers can possess certain processing advantages such as solution-processability and/or good stability (e.g., air stability) in ambient conditions. The polymers of the present teachings can be used alone or in combination with other compounds to prepare either p-type (donor or hole-transporting), n-type (acceptor or electron-transporting), or ambipolar semiconductor materials, which in turn can be used to fabricate various organic or hybrid optoelectronic articles, structures and devices, including organic photovoltaic devices and organic light-emitting transistors. In some embodiments, semiconductor materials incorporating one or more compounds of the present teachings can exhibit p-type semiconductor activity, ambipolar activity, light absorption, and/or light emission.

The present teachings, therefore, further provide methods of preparing a semiconductor material and composites (e.g., devices) including the semiconductor material. The methods can include preparing a composition (e.g., a solution or dispersion) that includes one or more polymeric compounds disclosed herein dissolved or dispersed in a liquid medium such as a solvent or a mixture of solvents, and depositing the composition on a substrate to provide a semiconductor material. The deposited semiconductor material can be processed further (e.g., subject to an annealing step) prior to formation of additional components thereon to complete a particular device structure.

Various articles of manufacture including optical devices, optoelectronic devices, and electronic devices such as thin film semiconductors, photovoltaic/solar cells, photodetectors (or photodiodes), organic light emitting devices such as organic light emitting transistors (OLETs), that make use of the polymers disclosed herein are within the scope of the present teachings as are methods of making the same. The present polymers can offer processing and operation advantages in the fabrication and/or the use of these devices.

For example, articles of manufacture such as the various devices described herein can be an optical or optoelectronic device including a first electrode, a second electrode, and a photoactive component disposed between the first electrode and the second electrode, where the photoactive component includes a polymer of the present teachings.

In various embodiments, the optical or optoelectronic device can be configured as a solar cell, in particular, a bulk heterojunction solar cell. Polymers of the present teachings can exhibit broad optical absorption and/or a tuned redox properties and bulk carrier mobilities, making them desirable for such applications. In various embodiments, the bulk heterojunction solar cells according to the present teachings can incorporate a blend material (e.g., a blended film) including a polymer of the present teachings as the donor material and an acceptor material as the photoactive layer.

Typical acceptor materials include fullerene-based compounds. Fullerenes useful in the present teachings can have a broad range of sizes (number of carbon atoms per molecule). The term fullerene as used herein includes various cage-like molecules of pure carbon, including Buckministerfullerene ($C_{60}$) "bucky ball" and the related "spherical" fullerenes as well as carbon nanotubes. Fullerenes can be selected from those known in the art ranging from, for example, $C_{20}$-$C_{1000}$. In certain embodiments, the fullerene can be selected from the range of $C_{60}$ to $C_{96}$. In particular embodiments, the fullerene can be a $C_{60}$ fullerene derivative or a $C_{70}$ fullerene derivative, such as [6,6]-phenyl-$C_{61}$-butyric acid methyl ester ($PC_{61}BM$ or simply PCBM) or [6,6]-phenyl-$C_{71}$-butyric acid methyl ester ($PC_{71}BM$). In some embodiments, chemically modified fullerenes can be used, provided that the modified fullerene retains acceptor-type and electron mobility characteristics. Some common fullerene derivatives include bisadduct of $PC_{61}BM$ (Bis-PCBM), indene-$C_{60}$ monoadduct (ICMA), and indene-$C_{60}$ bisadduct (ICBA). Further, other acceptor materials can be used in place of fullerenes, provided that they have the required acceptor-type and electron mobility characteristics. For example, the acceptor material can be various organic small molecules, polymers, carbon nanotubes, or inorganic particles (quantum dots, quantum rods, quantum tripods, $TiO_2$, ZnO etc.).

A photoactive component according to the present teachings can be prepared as a blended film deposited from a solution or dispersion ("a blend composition") containing a mixture of one or more of the present polymers and an acceptor compound such as fullerene (e.g., PCBM). For example, both the present polymer and the acceptor compound can be dissolved in chloroform, chlorobenzene, or a mixture thereof, where the present polymer and the acceptor compound together can be present in the solution from about 0.5 wt % to about 10 wt %, preferably, from about 0.8 wt % to about 5 wt %, and more preferably, from about 1 wt % to about 3 wt %. The ratio of the present polymer to the acceptor compound can range from about 10:1 to about 1:10 by weight; for example, from about 5:1 to about 1:5 by weight, from about 3:1 to about 1:3 by weight, or from about 2:1 to about 1:2 by weight. The photoactive layer also can contain a polymeric binder, which can be present from about 5% to about 95% by weight. The polymeric binder, for example, can be a semicrystalline polymer selected from polystyrene (PS), high-density polyethylene (HDPE), polypropylene (PP) and polymethylmethacrylate (PMMA). In some embodiments, the polymeric blend can be used together with additional components that are optically active, for example, components that can assist in light harvesting by capturing and transferring excitons to one or both of the electron-donor polymers/electron-acceptor polymers in the blend, and/or optically non-active components to modify and/or improve processing and/or device performance. Such optically non-active components can include alkanethiols (e.g., alkanedithiols) and other α,ω-functionalized alkanes (e.g., diiodoalkanes) as known in the art. See e.g., U.S. Pat. No. 8,227,691.

The blend composition can be deposited on a substrate (e.g., an electrode-substrate) preferably via a solution-phase process, followed by removal of the solvent or mixture of solvents to provide the photoactive layer. By having the blend composition provided as an intimate mixture of the present polymer and an acceptor compound, bulk heterojunctions are created upon removal of the solvent (optionally under reduced pressure and/or elevated temperature), during which nanoscale phase separation of the present donor polymers and the acceptor compound takes place. In some embodiments, the depositing step can be carried out by printing, including inkjet printing and various contact printing techniques (e.g., screen-printing, gravure printing, offset printing, pad printing, lithographic printing, flexographic printing, and microcontact printing). In other embodiments, the depositing step can be carried out by spin coating, slot-die coating, drop-casting, zone casting, dip coating, blade coating, or spraying. When the film is formed by spin coating, the spin speed can range from about 300 rpm to about 6000 rpm, or from about 500 rpm to about 2000 rpm. Subsequent processing steps can include thermal annealing or irradiation of the deposited film. For example, the blended film can be annealed from about 50° C. to about 300° C., preferably from about 70° C. to about 200° C., more preferably from about 90° C. to about 180° C. for about 1 min to about 20 minutes. The annealing step can be carried out under an inert atmosphere (e.g., under nitrogen). Irradiation of the deposited film can be carried out using infrared light or ultraviolet light. As used herein, "annealing" refers to a post-deposition heat treatment to the semicrystalline polymer film in ambient or under reduced/increased pressure for a time duration of more than 60 seconds, and "annealing temperature" refers to the maximum temperature that the polymer film is exposed to for at least 30 seconds during this process of annealing. The photoactive layer typically can have a thickness ranging from about 30 nm to about 500 nm. In preferred embodiments, the photoactive layer can be a thin film having a thickness of about 80-300 nm.

A representative solar cell generally includes a substrate, an anode, a cathode, and a photoactive layer between the anode and the cathode that can incorporate one or more polymers of the present teachings. In some embodiments, one or more optional interlayers can be present between the anode and the photoactive layer and/or between the cathode and the photoactive layer.

The substrate can be a solid, rigid or flexible layer designed to provide robustness to the device. In preferred embodiments, the substrate can be transparent or semi-transparent in the spectral region of interest. As used herein, a material is considered "transparent" when it has transmittance over 50%, and a material is considered "semi-transparent" when it has transmittance between about 50% and about 5%. The substrate can comprise any suitable material known in the art such as glass or a flexible plastic (polymer) film.

The first and second electrodes should have different work functions, with the electrode having the higher work function at or above about 4.5 eV (the "high work function electrode") serving as the hole-injecting electrode or anode, and the electrode having the lower work function at or below about 4.3 eV (the "low work function electrode") serving as the electron-injecting electrode. In a traditional OPV device structure, the high work function electrode or anode typically is composed of a transparent conducting metal oxide or metal sulfide such as indium tin oxide (ITO), gallium indium tin oxide (GITO), and zinc indium tin oxide (ZITO), or a thin, transparent layer of gold or silver. The low work function electrode or cathode typically is composed of a low work function metal such as aluminum, indium, calcium, barium, and magnesium. The electrodes can be deposited by thermal vapor deposition, electron beam evaporation, RF or Magnetron sputtering, chemical vapor deposition or the like.

In various embodiments, the solar cell can include one or more optional interface layers ("interlayers") between the anode and the photoactive layer and/or between the cathode and the photoactive layer. For example, in some embodiments, an optional smoothing layer (e.g., a film of 3,4-polyethylenedioxythiophene (PEDOT), or 3,4-polyethylenedioxythiophene:polystyrene-sulfonate (PEDOT:PSS)) can be present between the anode and the photoactive layer. The optional interlayer(s) can perform other functions such as reducing the energy barrier between the photoactive layer and the electrode, forming selective contacts for a single type of carrier (e.g., a hole-blocking layer), modifying the work function of the adjacent electrode, and/or protecting the underlying photoactive layer. In some embodiments, a transition metal oxide layer such as $V_2O_5$, $MoO_3$, $WO_3$ and NiO can be deposited on top of the ITO anode, instead of using PEDOT or PEDOT:PSS as the p-type buffer. To improve device stability via modification of the cathode, an n-type buffer composed of LiF, CsF or similar fluorides can be provided between the cathode and the photoactive layer. Other n-type buffer materials include $TiO_x$, $ZnO_x$ and Cs-doped $TiO_x$. Depending on the composition, the interlayers can be solution-processed (e.g., sol-gel deposition, self-assembled monolayers) or deposited by vacuum processes such as thermal evaporation or sputtering.

In certain embodiments, a solar cell according to the present teachings can include a transparent glass substrate onto which an electrode layer (anode) made of indium tin oxide (ITO) is applied. This electrode layer can have a relatively rough surface, and a smoothing layer made of a polymer, typically PEDOT:PSS made electrically conductive through doping, can be applied on top of the electrode layer to enhance its surface morphology. Other similar interlayers can be optionally present between the anode and the photoactive layer for improving mechanical, chemical, and/or electronic properties of the device. The photoactive layer is composed of an all-polymer blend as described above, and can have a layer thickness of, e.g., about 80 nm to a few µm. Before a counter electrode (cathode) is applied, an electrically insulating transition layer can be applied onto the photoactive layer. This transition layer can be made of an alkali halide, e.g., LiF, and can be vapor-deposited in vacuum. Again, similar to the anode, other similar interlayers can be optionally present between the photoactive layer and the cathode for improving mechanical, chemical, and/or electronic properties of the device.

In certain embodiments, a solar cell according to the present teachings can have an inverted device structure, where a modified ITO film is used as the cathode. For example, the ITO can be modified by n-type metal oxides or metal carbonates such as $TiO_x$, $ZnO_x$, Cs-doped $TiO_x$, and caesium carbonate. In particular embodiments, the inverted OPV can include a solution-processed $ZnO_x$ n-type interface layer as described in Lloyd et al., "Influence of the hole-transport layer on the initial behavior and lifetime of inverted organic photovoltaics," *Solar Energy Materials and Solar Cells*, 95(5): 1382-1388 (2011). Compared with the traditional device structure, inverted-type devices can demonstrate better long-term ambient stability by avoiding the need for the corrosive and hygroscopic hole-transporting PEDOT:PSS and low work function metal cathode. The anode of an inverted OPV cell can be composed of Ag, Au, and the like, with an optional p-type interface layer composed of transition metal oxides such as $V_2O_5$, $MoO_3$, $WO_3$ and NiO.

Another aspect of the present teachings relates to methods of fabricating an organic light-emitting transistor or an organic light-emitting diode (OLED) that incorporates one or more semiconductor materials of the present teachings.

For example, in an OLED, one or more compounds of the present teachings can be used as electron-transporting and/or emissive and/or hole-transporting materials. An OLED generally includes a substrate, a transparent anode (e.g., ITO), a cathode (e.g., metal), and one or more organic layers which can incorporate one or more compounds of the present teachings as hole-transporting (p-channel) and/or emissive and/or electron-transporting (n-channel) materials. In embodiments where the present compounds only have one or two of the properties of hole transport, electron transport, and emission, the present compounds can be blended with one or more further organic compounds having the remaining required property or properties.

In other embodiments, the article of manufacture can be an electronic or optoelectronic device (e.g., an organic light-emitting transistor) including a first electrode, a second electrode, and a semiconducting component in contact with the first electrode and the second electrode, where the semiconducting component includes a compound of the present teachings. These devices can include a composite having a semiconducting component (or semiconductor material) of the present teachings and a substrate component and/or a dielectric component. The substrate component can be selected from doped silicon, an indium tin oxide (ITO), ITO-coated glass, ITO-coated polyimide or other plastics, aluminum or other metals alone or coated on a polymer or other substrate, a doped polythiophene, and the like. The dielectric component can be prepared from inorganic dielectric materials such as various oxides (e.g., $SiO_2$, $Al_2O_3$, $HfO_2$), organic dielectric materials such as various polymeric materials (e.g., polycarbonate, polyester, polystyrene, polyhaloethylene, polyacrylate), and self-assembled superlattice/self-assembled nanodielectric (SAS/SAND) materials (e.g., as described in Yoon, M-H. et al., PNAS, 102 (13): 4678-4682 (2005), the entire disclosure of which is incorporated by reference herein), as well as hybrid organic/inorganic dielectric materials (e.g., described in U.S. patent application Ser. No. 11/642,504, the entire disclosure of which is incorporated by reference herein). In some embodiments, the dielectric component can include the crosslinked polymer blends described in U.S. patent application Ser. Nos. 11/315,076, 60/816,952, and 60/861,308, the entire disclosure of each of which is incorporated by reference herein. The composite also can include one or more electrical contacts. Suitable materials for the source, drain, and gate electrodes include metals (e.g., Au, Al, Ni, Cu), transparent conducting oxides (e.g., ITO, IZO, ZITO, GZO, GIO, GITO), and conducting polymers (e.g., poly(3,4-ethylenedioxythiophene)poly(styrenesulfonate) (PEDOT:PSS), polyaniline (PANI), polypyrrole (PPy)).

The following examples are provided to illustrate further and to facilitate the understanding of the present teachings and are not in any way intended to limit the invention.

All reagents were commercially available and were used without further purification unless otherwise stated. Anhydrous dichloromethane was distilled from $CaH_2$; THF and toluene were distilled from Na/benzophenone. Monomer 2,5-bis(trimethylstannyl)thiophene was purchased from Sigma-Aldrich. $PC_{71}BM$ was purchased from American Dye Source, Inc. (ADS71BFA; purity >99%). 2,2'-Bithiophene-3,3'-dicarboxylic anhydride was prepared following procedures described in Letizia et al., "N-channel polymers by design: Optimizing the interplay of solubilizing substituents, crystal packing, and field-effect transistor characteristics in polymeric bithiophene-imide semiconductors," J. Am. Chem. Soc., 130: 9679-9694 (2008). 2-Hexyldecyl amine and 1,3-bis[5-bromo-3-(n-dodecyl)thien-2-yl]-5-(2-hexyldecyl)thieno[3,4-c]pyrrole-4,6-dione were prepared following procedures described in Guo et al., "Thieno[3,4-c]pyrrole-4,6-dione-based polymer semiconductors: Toward high-performance, air-stable organic thin-film transistors," J. Am. Chem. Soc., 133: 13685-13697 (2011). 2-(Trimethylstannyl)-3-decylthiophene was prepared following procedures described in Biniek et al., "A [3,2-b]thienothiophene-alt-benzothiadiazole copolymer for photovoltaic applications: design, synthesis, material characterization and device performances," J. Mater. Chem., 19: 4946-4951 (2009).

Unless otherwise stated, all reactions were carried out under inert atmosphere using standard Schlenk line techniques. UV-Vis spectra were recorded on a Varian Cary 50 Scan UV-Vis spectrophotometer. The solution absorption spectra of polymers were recorded on $10^{-5}$ M (based on repeating units) chloroform solutions, and the polymer film absorption spectra were recorded from films cast from 5 mg/mL chloroform solutions. Differential scanning calorimetry (DSC) was performed on a TA model DSC 2920 with a heating ramp of 10° C./min under $N_2$. NMR spectra were recorded on Varian Unity Plus 500 (500 MHz, room temperature) or Mercury (400 MHz, high temperature) spectrometers, and chemical shifts are referenced to residual protio-solvent signals. Elemental analyses (EA) of monomers and polymer samples were performed by Midwest Microlab (Indianapolis, Ind.). The electrochemical properties of the polymers were investigated as thin films in anhydrous acetonitrile under $N_2$ at a scan rate of 50 mV/s using 0.1 M tetrakis(n-butyl)ammonium hexafluorophosphate [$(n-Bu)_4N^+PF_6^-$] as the supporting electrolyte. Pt electrodes were used as both the working and counter electrodes, and an Ag wire was used as the pseudoreference electrode. Polymer films were drop-cast onto the Pt working electrode from a 0.2% (w/w) chloroform solution. Polymer molecular weights were determined on a Polymer Laboratories PL-GPC 220 using trichlorobenzene as eluent at 170° C. vs polystyrene standards. Grazing incidence x-ray scattering measurements were performed at Beamline 8ID of the Advanced Photon Source at Argonne National Laboratory. See Jiang et al., "The dedicated high-resolution grazing-incidence X-ray scattering beamline 8-ID-E at the advanced photon source," J. Synchrotron Rad., 19: 627-636 (2012). An x-ray wavelength of $\lambda=1.6868$ Å was used and data were collected using a 30 s exposure at a sample-detector distance of 204 mm with a Pilatus photodiode array. Geometries, orbital topologies, and HOMO and LUMO energies were optimized using Density Functional Theory (DFT) computation. The B3LYP functional and the 6-31 G** basis set were used as implemented in GAUSSIAN 03. See Becke, "Density-functional thermochemistry. III. The role of exact exchange," J. Chem. Phys., 98: 5648-5652 (1993); Francl et al., "Self-consistent molecular-orbital methods. XXIII. A polarization-type basis set for second-row elements," J. Chem. Phys., 77: 3654-3665 (1982); and Frisch et al., "Gaussian 03, Revision B.04" Gaussian, Inc., Pittsburgh Pa., 2003.

Example 1

Synthesis of N-(2-hexydecyl)-5,5'-bis(5-bromo-3-decylthiophen-2-yl)-2,2'-bithiophene-3,3'-dicarboximide Step 1: Synthesis of 3-(2-hexyldecyl)carbamoyl-3'-carboxylic acid-2,2'-bithiophene 1a

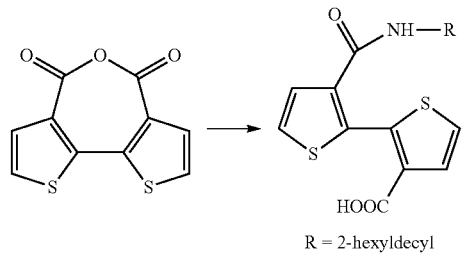

R = 2-hexyldecyl

A solution of 2-hexyldecyl amine solution (8.26 g, 0.0342 mol) in 500 mL of dichloromethane was added dropwise to the solution of 2,2'-bithiophene-3,3'-dicarboxylic anhydride (8.08 g, 0.0342 mol) in 500 mL of dichloromethane. After addition, the reaction was stirred under reflux for 2 hours. Upon removal of the solvent, the residue oil was purified by column chromatography using ethyl acetate as eluent to give the product 1a (15.68 g, 96% yield). $^1$H NMR (500 MHz, CDCl$_3$, ppm): δ 7.49 (d, 1H), 7.40 (d, 1H), 7.37 (d, 1H), 7.27 (d, 1H), 6.02 (s, 1H), 3.27 (m, 2H), 1.48 (m, 1H), 1.22 (m, 24H), 0.85 (m, 6H).

Step 2: Synthesis of N-(2-hexyldecyl)-2,2'-bithiophene-3,3'-dicarboximide 1b

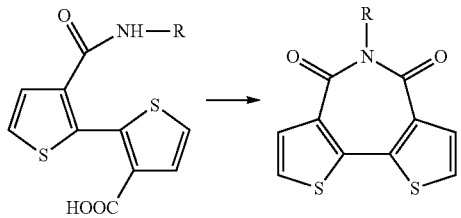

R = 2-hexyldecyl

A solution of 1a (15.68 g, 0.0328 mol) in 100 mL of thionyl chloride was heated under reflux for 2 hours. Then all thionyl chloride was removed under vacuum. The residual oil was purified by column chromatography using dichloromethane:hexane (1:1) as eluent, to give the product 1b (13.28 g, 88% yield). $^1$H NMR (500 MHz, CDCl$_3$, ppm): δ 7.72 (d, 2H), 7.23 (d, 2H), 4.24 (d, 2H), 1.92 (m, 1H), 1.28 (m, 24H), 0.87 (m, 6H). $^{13}$C NMR (125 MHz, CDCl$_3$, ppm): δ 162.53, 137.59, 133.48, 133.28, 124.42, 49.62, 36.62, 32.10, 32.03, 31.86, 31.84, 30.28, 29.96, 29.75, 29.52, 26.63, 26.60, 22.88, 22.86, 14.34, 14.32.

Step 3: Synthesis of N-(2-hexyldecyl)-5,5'-dibromo-2,2'-bithiophene-3,3'-dicarboximide 1c

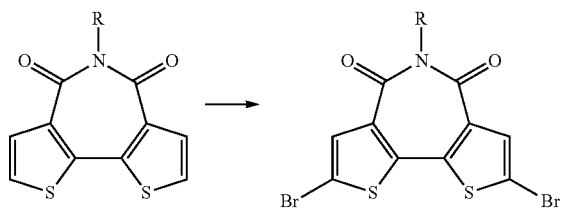

Bromine (2.34 g, 14.6 mmol) was added to a solution of imide 1b (1.68 g, 3.65 mmol) in 30 mL of dichloromethane followed by addition of ferric chloride (11.8 mg, 0.07 mmol). The reaction mixture was allowed to stir in the dark for 6 h before 10 mL of saturated aqueous Na$_2$SO$_3$ was added and stirring continued for 0.5 h. The reaction mixture was then poured into 300 mL of dichloromethane, washed three times with 200 mL of water and once with 100 mL of brine, and dried over Mg$_2$SO$_4$. The organic solution was next filtered and concentrated by evaporation to give a light yellow solid, which was purified by column chromatography using DCM:hexane (1:1) as eluent to give the product 1c (2.23 g, 98% yield). $^1$H NMR (500 MHz, CDCl$_3$, ppm): δ 7.66 (s, 2H), 4.17 (d, 2H), 1.86 (m, 1H), 1.24 (m, 24H), 0.87 (m, 6H). $^{13}$C NMR (125 MHz, CDCl$_3$, ppm): δ 160.95, 137.54, 135.73, 133.56, 112.71, 49.84, 36.51, 32.13, 32.04, 31.82, 31.77, 30.24, 29.94, 29.77, 29.54, 26.58, 22.90, 22.87, 14.36, 14.33.

Step 4: Synthesis of N-(2-hexyldecyl)-5,5'-bis(3-decylthiophen-2-yl)-2,2'-'bithiophene-3,3'-dicarboximide 1d

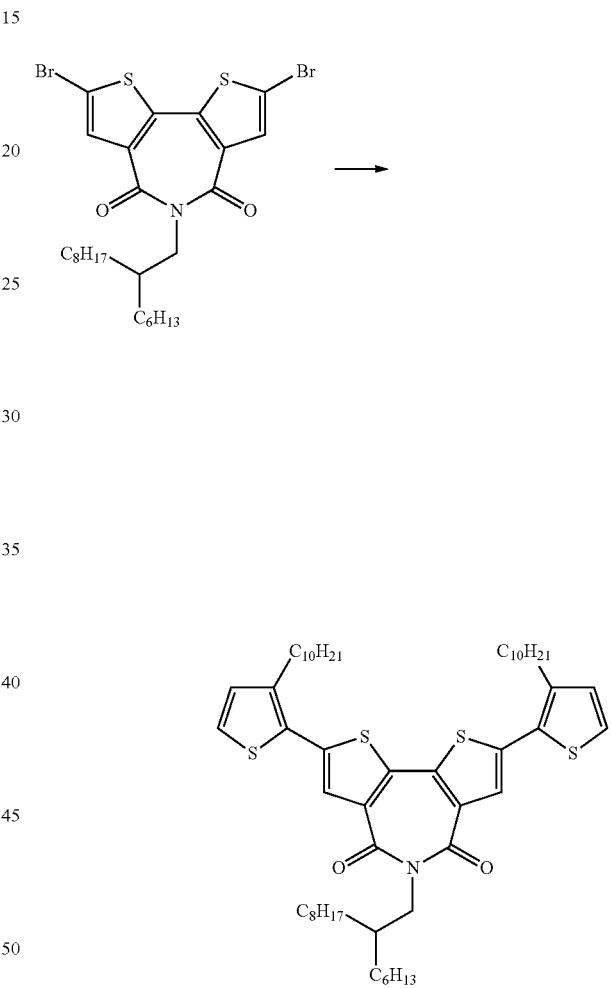

An air-free flask was charged with 1c (1.32 g, 2.14 mmol), 2-(trime-thylstannyl)-3-decylthiophene (2.48 g, 6.41 mmol), bis(triphenylphosphine)palladium (II) dichloride (150 mg, 0.21 mmol), and 60 mL of THF. The reaction mixture was stirred at 90° C. for 12 h, then the solvent was removed by evaporation to afford a red solid, which was purified by column chromatography over silica gel with CH$_2$Cl$_2$/hexane (1:3) as eluent to afford an orange oil as the product 1d (1.31 g, 68% yield). $^1$H NMR (500 MHz, CDCl$_3$, ppm): δ 7.74 (s, 2H), 7.27 (d, 2H), 6.97 (d, 2H), 4.27 (d, 2H), 2.82 (t, 4H), 1.95 (m, 1H), 1.68 (m, 4H), 1.26 (m, 52H), 0.87 (m, 12H). $^{13}$C NMR (125 MHz, CDCl$_3$, ppm): δ 162.14, 141.59, 136.17, 135.41, 133.34, 130.91, 130.47, 128.80, 125.46, 49.80, 36.60, 32.13, 32.06, 30.70, 30.33, 30.00, 29.92, 29.89, 29.87, 29.82, 29.79, 29.67, 29.57, 29.55, 29.53, 22.90, 22.88, 14.32.

Step 5: Synthesis of N-(2-hexydecyl)-5,5'-bis(5-bromo-3-decylthiophen-2-yl)-2,2'-bithiophene-3,3'-dicarboximide 1e

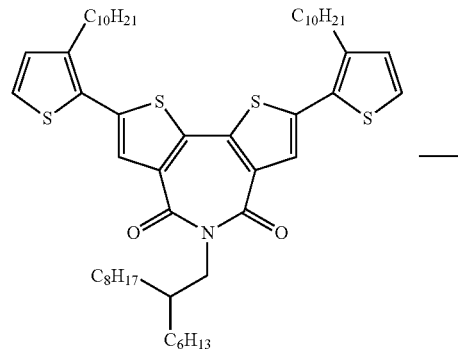

Bromine (320 mg, 2 mmol) was added to a solution of 1d (904 mg, 1 mmol) in CHCl$_3$/HOAC (4:1; total volume=40 mL) in one portion. The reaction mixture was stirred at room temperature for 4 h, and 50 mL of H$_2$O was then added. Next, the reaction mixture was extracted three times with 50 mL of CH$_2$Cl$_2$, and the combined organic layer was washed with 50 mL of H$_2$O, 50 mL of 10% aqueous KOH solution, 50 mL of brine, and dried over MgSO4. After filtration, the solvent was removed by evaporation to afford an orange solid, which was purified by column chromatography over silica gel with CH$_2$Cl$_2$/hexane (1:3) as eluent. The desired product was obtained as an orange solid (945 mg, 89% yield). $^1$H NMR (500 MHz, CDCl$_3$, ppm): δ 7.67 (s, 2H), 6.94 (s, 2H), 4.25 (d, 2H), 2.74 (t, 4H), 1.93 (m, 1H), 1.64 (m, 4H), 1.26 (m, 52H), 0.87 (m, 12H). $^{13}$C NMR (125 MHz, CDCl$_3$, ppm): δ 162.05, 142.34, 136.29, 134.10, 133.53, 133.17, 131.46, 130.08, 112.72, 49.75, 36.67, 32.14, 32.12, 30.59, 30.33, 29.99, 29.83, 29.80, 29.77, 29.61, 29.56, 29.47, 26.67, 22.90, 14.33.

Example 2

Synthesis of P(BTBT) P1

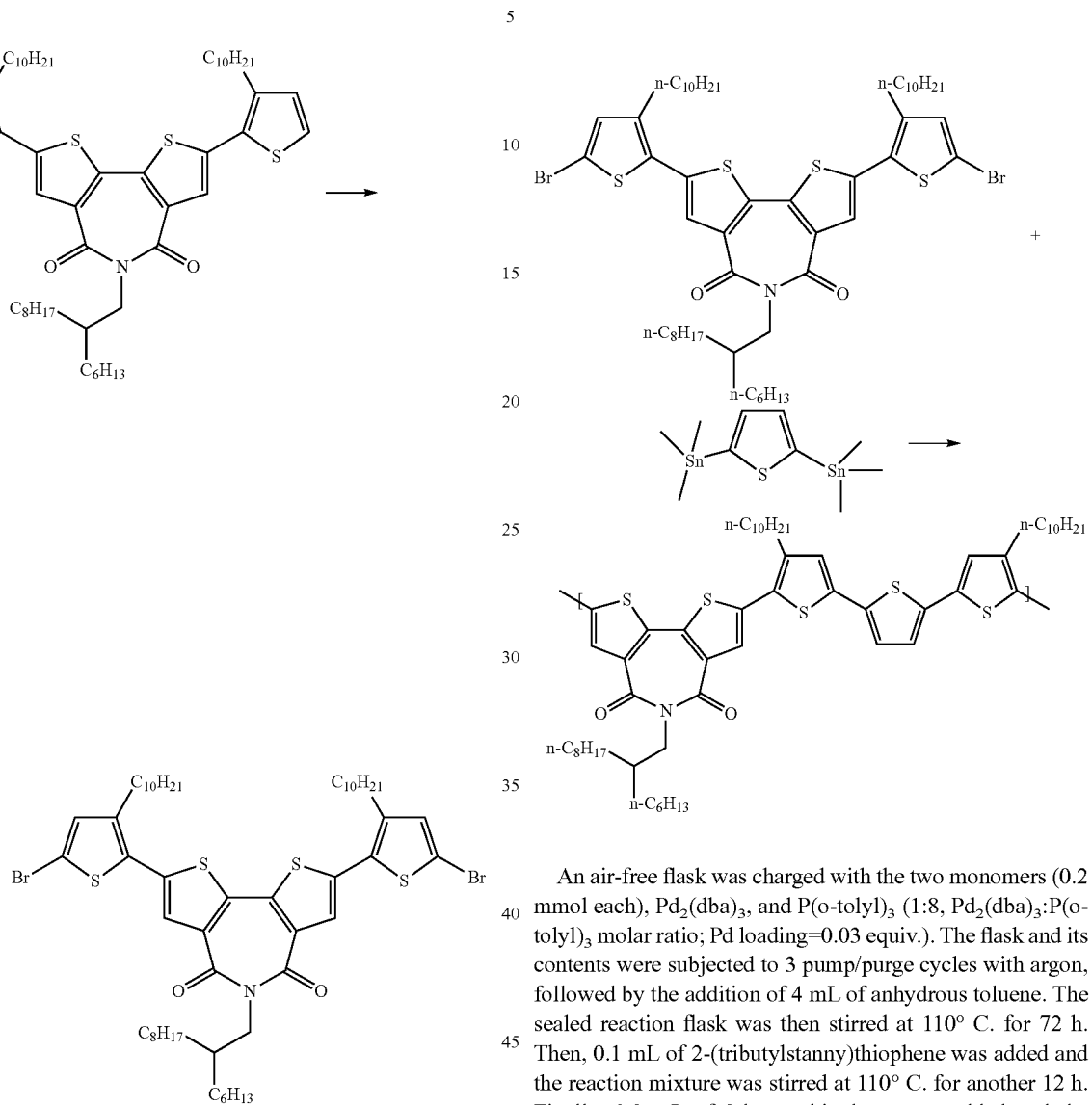

An air-free flask was charged with the two monomers (0.2 mmol each), Pd$_2$(dba)$_3$, and P(o-tolyl)$_3$ (1:8, Pd$_2$(dba)$_3$:P(o-tolyl)$_3$ molar ratio; Pd loading=0.03 equiv.). The flask and its contents were subjected to 3 pump/purge cycles with argon, followed by the addition of 4 mL of anhydrous toluene. The sealed reaction flask was then stirred at 110° C. for 72 h. Then, 0.1 mL of 2-(tributylstanny)thiophene was added and the reaction mixture was stirred at 110° C. for another 12 h. Finally, 0.2 mL of 2-bromothiophene was added and the reaction mixture was stirred for another 12 h. After cooling to room temperature, the reaction mixture was dripped into 100 mL of methanol (containing 5 mL 12 N HCl) with vigorous stirring. After 4 h of stirring, the polymer was transferred to a thimble. After drying, the crude product was subjected to Soxhlet extraction using methanol, acetone, hexane, dichloromethane, and chloroform as solvents. After the final extraction with chloroform, the polymer solution was then precipitated in 100 mL of methanol with vigorous stirring. The product polymer was collected by filtration and dried to afford a blue solid as the product (140 mg, 71%). $^1$H NMR (400 MHz, C$_2$D$_2$Cl$_4$, 130° C., ppm): δ 7.81 (br, 2H), 7.16 (br, 2H), 7.10 (br, 2H), 4.33 (br, 2H), 2.88 (m, 4H), 2.05 (br, 1H), 1.80 (m, 4H), 1.47-1.36 (m, 52H), 0.95 (m, 12H). M$_n$=31 kDa, PDI=2.9. Anal. Calcd for C$_{58}$H$_{8i}$NO$_2$S$_5$(%): C, 70.75; H, 8.29; N, 1.42. Found (%), C, 70.89; H, 8.53; N, 1.54. M$_n$=31 kDa, PDI=2.9.

Example 3

Synthesis of P(BTI4T) P2

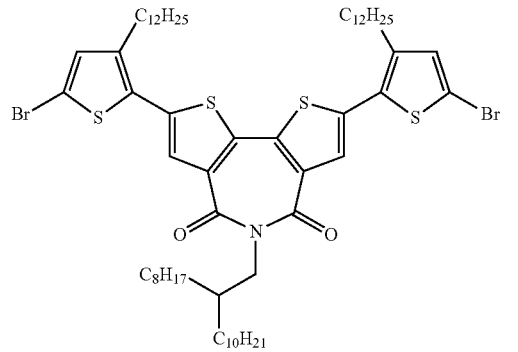

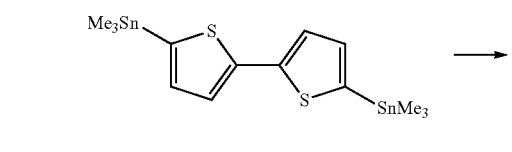

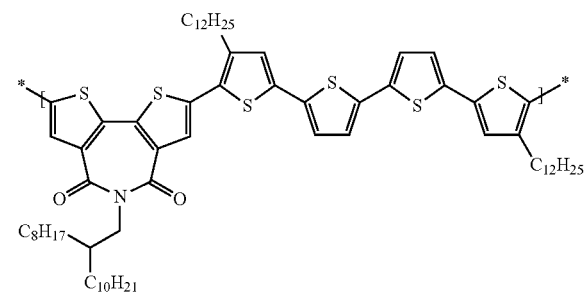

An air-free flask was charged with the two monomers (0.2 mmol each), $Pd_2(dba)_3$, and $P(o\text{-tolyl})_3$ (1:8, $Pd_2(dba)_3$:P(o-tolyl)$_3$ molar ratio; Pd loading=0.03 equiv.). The flask and its contents were subjected to 3 pump/purge cycles with argon, followed by the addition of 4 mL of anhydrous toluene. The sealed reaction flask was then stirred at 110° C. for 72 h. Then, 0.1 mL of 2-(tributylstannyl)thiophene was added and the reaction mixture was stirred at 110° C. for another 12 h. Finally, 0.2 mL of 2-bromothiophene was added and the reaction mixture was stirred for another 12 h. After cooling to room temperature, the reaction mixture was dripped into 100 mL of methanol (containing 5 mL 12 N HCl) with vigorous stirring. After 4 h of stirring, the polymer was transferred to a thimble. After drying, the crude product was subjected to Soxhlet extraction using methanol, acetone, hexane, dichloromethane, and chloroform as solvents. After the final extraction with chloroform, the polymer solution was then precipitated in 100 mL of methanol with vigorous stirring. The product polymer was collected by filtration and dried to afford a blue solid as the product (99 mg, 42%). $^1$H NMR (400 MHz, $C_2D_2Cl_4$, 130° C., ppm): δ 7.82 (s, 2H), 7.19 (s, 4H), 7.12 (s, 2H), 4.33 (br, 2H), 2.89 (m, 4H), 2.05 (br, 1H), 1.80 (m, 4H), 1.47-1.35 (m, 68H), 0.95 (m, 12H). $M_n$=12 kDa, PDI=2.6.

Example 4

Synthesis of P(TPD3T) P3

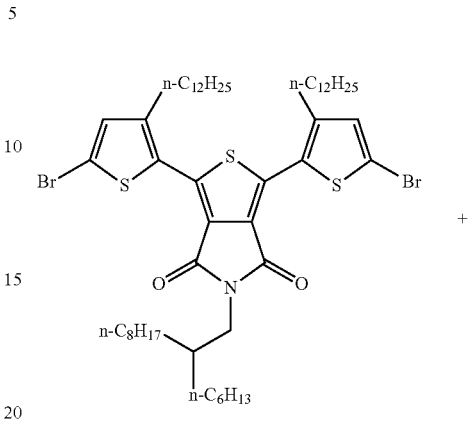

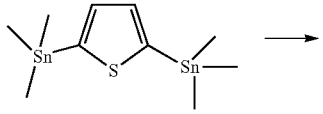

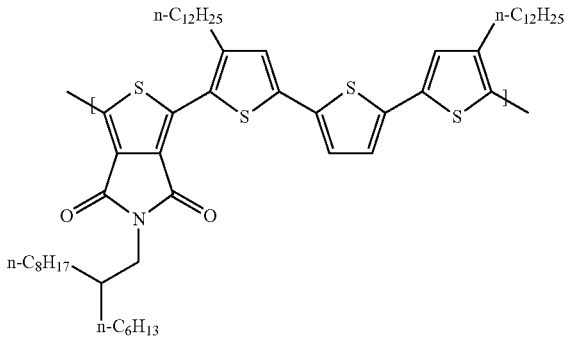

The polymer P3 was prepared following the procedure for the polymer P1 using 2,5-bis(trimethylstannyl)thiophene and 1,3-bis[5-bromo-3-(n-dodecyl)thien-2-yl]-5-(2-hexyldecyl)thieno[3,4-c]pyrrole-4,6-dione as monomers. The monomer 1,3-bis[5-bromo-3-(n-dodecyl)thien-2-yl]-5-(2-hexyldecyl)thieno[3,4-c]pyrrole-4,6-dione can be prepared according to the procedures described in Guo et al., "Thieno [3,4-c]pyrrole-4,6-dione-based polymer semiconductors: Toward high-performance, air-stable organic thin-film transistors," *J. Am. Chem. Soc.*, 133: 13685-13697 (2011). After the final extraction with chloroform, the polymer solution was then precipitated in 100 mL of methanol with vigorous stirring. The polymer was collected by filtration and dried to afford a blue solid as the product (169 mg, 88%). $^1$H NMR (400 MHz, $C_2D_2Cl_4$, 130° C., ppm): δ 7.25 (s, 2H), 7.19 (s, 2H), 3.62 (br, 2H), 2.89 (m, 4H), 1.95 (br, 1H), 1.77 (m, 4H), 1.46-1.36 (m, 60H), 0.96 (m, 12H). $M_n$=40 kDa, PDI=2.5. Anal. Calcd for $C_{58}H_{87}NO_2S_4$(%): C, 72.67; H, 9.15; N, 1.46. Found (%), C, 72.98; H, 9.33; N, 1.52. $M_n$=40 kDa, PDI=2.5.

Example 5

Synthesis of Comparative Polymer P(BTI2T) P4

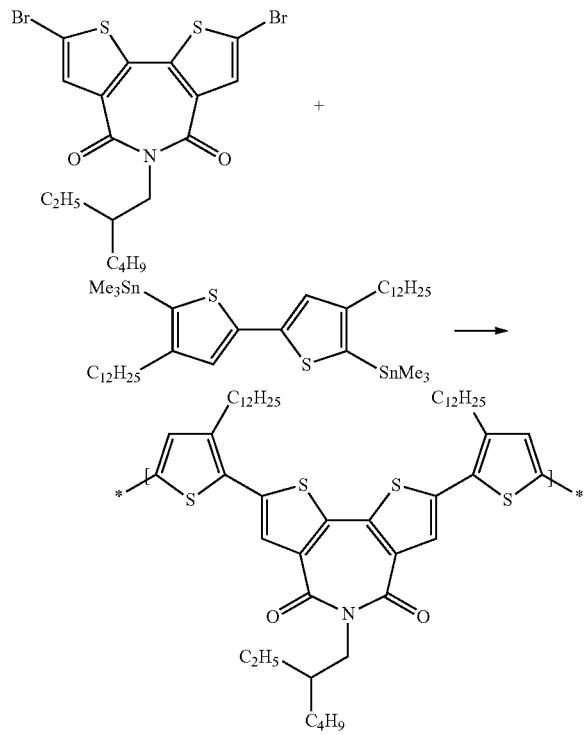

An air-free flask was charged with the two monomers (0.2 mmol each), Pd$_2$(dba)$_3$, and P(o-tolyl)$_3$ (1:8, Pd$_2$(dba)$_3$:P(o-tolyl)$_3$ molar ratio; Pd loading=0.03 equiv.). The flask and its contents were subjected to 3 pump/purge cycles with argon, followed by the addition of 4 mL of anhydrous toluene. The sealed reaction flask was then stirred at 110° C. for 72 h. Then, 0.1 mL of 2-(tributylstannyl)thiophene was added and the reaction mixture was stirred at 110° C. for another 12 h. Finally, 0.2 mL of 2-bromothiophene was added and the reaction mixture was stirred for another 12 h. After cooling to room temperature, the reaction mixture was dripped into 100 mL of methanol (containing 5 mL 12 N HCl) with vigorous stirring. After 4 h of stirring, the polymer was transferred to a thimble. After drying, the crude product was subjected to Soxhlet extraction using methanol, acetone, hexane, dichloromethane, and chloroform as solvents. After the final extraction with chloroform, the polymer solution was then precipitated in 100 mL of methanol with vigorous stirring. The product polymer was collected by filtration and dried to afford a blue solid as the product (46 mg, 27%). $^1$H NMR (400 MHz, C$_2$D$_2$Cl$_4$, 130° C., ppm): δ 7.84 (s, 2H), 7.14 (s, 2H), 4.35 (s, 2H), 2.90 (s, 4H), 2.01 (br, 1H), 1.81 (m, 4H), 1.46-1.36 (m, 44H), 0.96 (m, 12H). M$_n$=9 kDa, PDI=2.5.

Example 6

Characterization of Polymers P1 and P3

The present polymers exhibit good solubility/processibility (>15 mg/mL) and respectable molecular weights by introducing appropriate core alkyl substituents. The P1 and P3 film absorption onsets at 686 and 681 nm, respectively, (FIG. 1c) yield optical bandgaps (E$_g^{opt}$s) of 1.82 and 1.81 eV, respectively. Frontier molecular orbital (FMO) energies were estimated by cyclic voltammetry, and the derived HOMO energies are −5.58 eV and −5.55 eV for P1 and P3, respectively. Such low-lying HOMOs should favor higher V$_{oc}$s in polymer:PCBM cells, while >0.3 eV polymer-fullerene LUMO-LUMO offsets should favor exciton dissociation (FIG. 1d).

Figure 2:
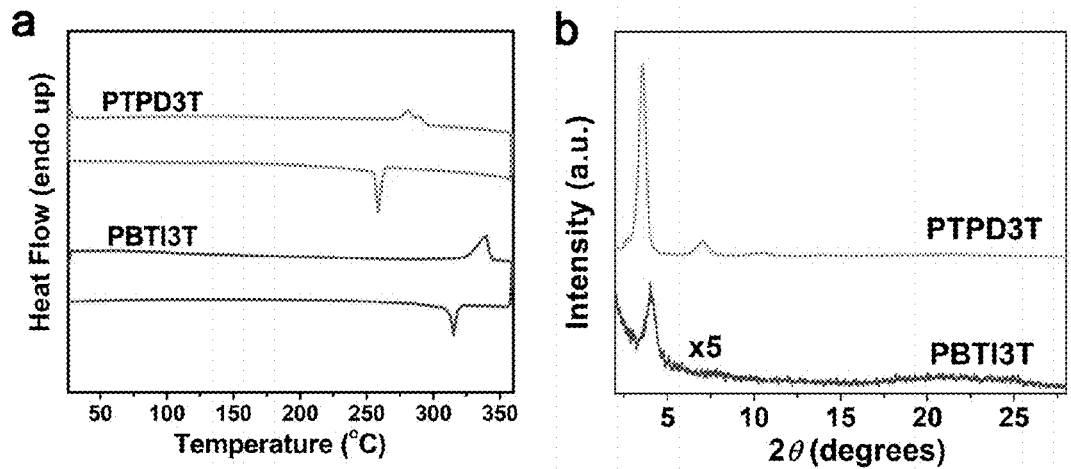
FIG. 2 shows differential scanning calorimetry thermograms and X-ray scattering patterns of certain embodiments of the present semiconducting polymers. a) DSC thermograms of polymers P(TPD3T) and P(BTI3T) at a temperature ramp rate of 10° C./min under $N_2$. The top lines are from the heating run and the bottom lines are from the cooling run. b) θ-2θ XRD scattering patterns from P(TPD3T) and P(BTI3T) films spin-coated on OTS-modified $Si/SiO_2$ substrates after annealing at 240° C. for 0.5 h.

Polymer film crystallinity was first investigated by differential scanning calorimetry (DSC), which revealed thermal transitions at 340° C./315° C. and 281° C. (and 290° C.)/259° C. for P1 and P3, respectively (FIG. 2a), indicating significant crystallinity, unlike typical TPD/BTI-benzodithiophene/dithienosilole copolymers where such transitions are not detected. X-ray diffraction (XRD, FIG. 2b) scans of P1 and P3 films evidence distinctive Bragg features, with P3 showing reflections up to third order, indicating significantly higher crystallinity than P1. That the diffraction patterns indicate crystalline film microstructures, especially for P3, stands in contrast to many high-performance PSC polymers, which have amorphous or far less crystalline microstructures.

Table 1 summarizes optical and electrochemical properties of polymers P1 and P3.

TABLE 1

| Polymer | λ$_{max}$ abs film (nm)$^a$ | λ$_{onset}$ abs film (nm)$^a$ | E$_{HOMO}$ (eV)$^b$ | E$_{LUMO}$ (eV)$^c$ | E$_g^{opt}$ (eV)$^d$ |
|---|---|---|---|---|---|
| P1 | 628 | 686 | −5.58 | −3.77 | 1.81 |
| P3 | 582 | 681 | −5.55 | −3.73 | 1.82 |

$^a$Absorption spectra from pristine film spin-cast from 5 mg/mL chloroform solution.
$^b$Electrochemically determined vs Fc/Fc$^+$.
$^c$Calculated according to: E$_{LUMO}$ = E$_g^{opt}$ + E$_{HOMO}$.
$^d$Optical bandgap estimated from absorption edge of as-cast thin film.

Example 7

Device Fabrication and Characterization

Figure 3:
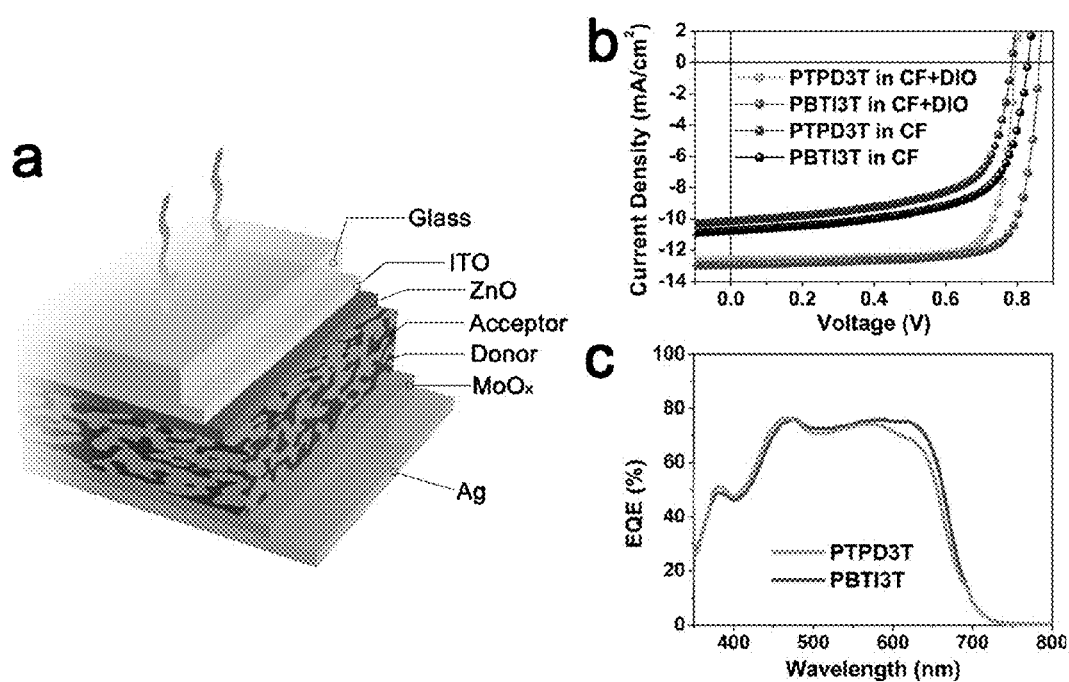
FIG. 3 shows the device architecture and performance of inverted bulk-heterojunction polymer solar cells incorporating certain embodiments of the present polymers. a) Inverted device architecture, ITO/ZnO/polymer:$PC_{71}BM$/$MoO_x$/Ag. b) J-V characteristics of P(TPD3T):$PC_{71}BM$ and P(BTI3T):$PC_{71}BM$ BHJ inverted solar cells fabricated using chloroform (CF) as solvent without and with DIO as the processing additive under 1000 $Wm^{-2}$ AM 1.5G illumination. c) EQE spectra of optimized P(TPD3T) and P(BTI3T) inverted BHJ solar cells fabricated using chloroform (CF) as the solvent and DIO as the processing additive.

BHJ cells employing the inverted architectures, ITO/ZnO/polymer:PC$_{71}$BM/MoO$_x$/Ag (FIG. 3a), were fabricated. Pre-patterned ITO-coated glass (Thin Film Devices, Inc.) with a sheet resistance of ~1052/o was used as the substrate. It was cleaned by sequential sonication in hexane, deionized water, methanol, isopropanol, and acetone. After UV/ozone treatment (Jelight Co.) for 20 minutes, a ~20-nm electron transport/hole blocking (electron extraction) layer of N-type ZnO was prepared by spin-coating at 5000 rpm a precursor solution prepared from 0.5 M zinc acetate dehydrate in 0.5 M monoethanolamine and 2-methoxyethanol under air. After cleaning the electrical contacts, the ZnO substrates were immediately baked in air at 170° C. for 10 minutes, then rinsed with DI water, isopropanol, and acetone, and then dried in a glovebox. Active layer solutions were prepared from 8-10 mg/mL solutions of the polymer with PC$_{71}$BM in chloroform (CF), chlorobenzene(CB)/DIO or CF/DIO in various ratios. For optimum device performance, the devices were spun cast at 5000 rpm and 3000 rpm, respectively. After spin-coating the active layer, a ~7.5-nm MoO$_x$ hole extraction layer was vacuum-deposited, followed by thermal evaporation of a ~140-nm Ag anode through a shadow mask at ~10$^{-6}$ Torr. Due to the inverted structure and accompanying environmental stability, device characterization was performed in ambient without encapsulation.

Comparative devices were fabricated similarly using blend solutions composed of P4 and $PC_{61}BM$. All the blend solutions were prepare by dissolving P4 and $PC_{61}BM$ in ortho-dichlorobenzene host solvent and by incorporating small amounts of diiodooctane as processing additives.

For device characterization, J-V characteristics were measured under AM1.5G light (100 mW/cm$^2$) using the Xe arc lamp of a Spectra-Nova Class A solar simulator. The light intensity was calibrated using an NREL-certified monocrystalline Si diode coupled to a KG3 filter to bring spectral mismatch to unity. A Keithley 2400 source meter was used for electrical characterization. The area of all devices was 6 mm$^2$, and a 6 mm$^2$ aperture was placed on top of cells during all measurements. EQEs were characterized using an Oriel model QE-PV-SI instrument equipped with a NIST-certified Si diode. Monochromatic light was generated from an Oriel 300 W lamp source.

Tables 2-5 below summarize the performance of different solar cell devices.

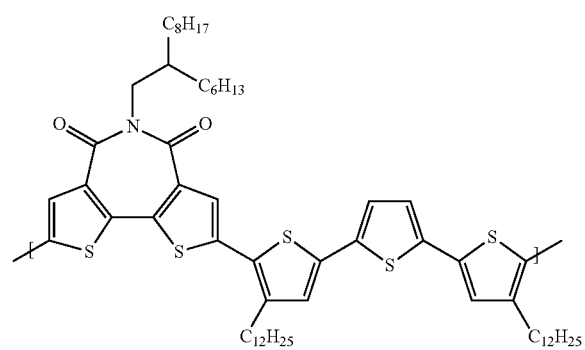

P1

TABLE 2

| Polymer/PC$_{71}$BM | Solvent | $V_{oc}$ (V) | $J_{SC}$ (mA/cm$^2$) | FF (%) | PCE (%) |
|---|---|---|---|---|---|
| P1:PC$_{71}$BM = 1:2 | CF:DIO = 100:2 | 0.859 | 12.9 | 77.8 | 8.66 |
| P1:PC$_{71}$BM = 1:2 | CB:DIO = 100:2 | 0.817 | 11.3 | 70.2 | 7.12 |
| P1:PC$_{71}$BM = 1:1 | CB:DIO = 100:2 | 0.851 | 13.1 | 75.0 | 8.37 |

CF: chloroform;
CB: chlorobenzene;
DIO: diiodooctane

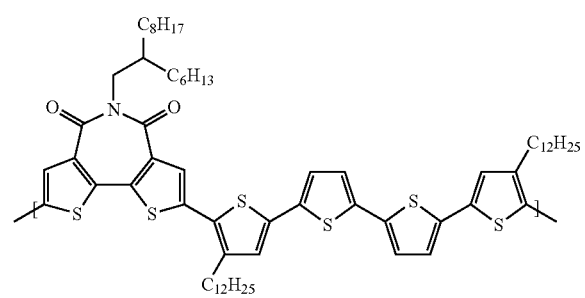

P2

TABLE 3

| Polymer/PC$_{71}$BM | Solvent | $V_{oc}$ (V) | $J_{SC}$ (mA/cm$^2$) | FF (%) | PCE (%) |
|---|---|---|---|---|---|
| P2:PC$_{71}$BM = 1:1.5 | CF:DIO = 100:2 | 0.767 | 8.34 | 48.9 | 3.12 |
| P2:PC$_{71}$BM = 1:2 | CF:DIO = 100:2 | 0.745 | 9.30 | 68.4 | 4.74 |
| P2:PC$_{71}$BM = 1:1 | CF:DIO = 100:2 | 0.665 | 10.93 | 52.3 | 3.80 |

CF: chloroform;
DIO: diiodooctane

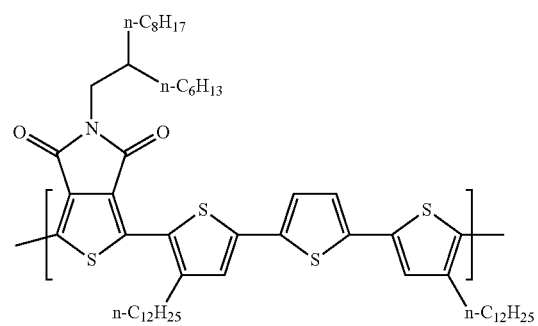

P3

TABLE 4

| Polymer/PC$_{71}$BM | Solvent | $V_{oc}$ (V) | $J_{SC}$ (mA/cm$^2$) | FF (%) | PCE (%) |
|---|---|---|---|---|---|
| P3:PC$_{71}$BM = 1:1.5 | CF:DIO = 98:2 | 0.782 | 12.4 | 76.1 | 7.38 |
| P3:PC$_{71}$BM = 1:2 | CF:DIO = 99:1 | 0.781 | 11.1 | 73.9 | 6.41 |
| P3:PC$_{71}$BM = 1:2 | CF:DIO = 97:3 | 0.767 | 12.0 | 78.5 | 7.23 |

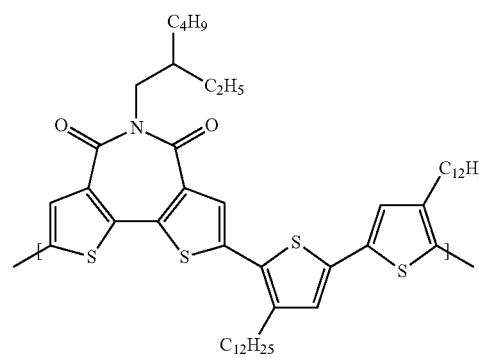

P4

TABLE 5

| Polymer/PC$_{61}$BM | Solvent | $V_{oc}$ (V) | $J_{SC}$ (mA/cm$^2$) | FF (%) | PCE (%) |
|---|---|---|---|---|---|
| P4:PC$_{61}$BM = 1:1 | DCB:DIO = 100:0 | 0.478 | 1.84 | 28.9 | 0.25 |
| P4:PC$_{61}$BM = 1:1.5 | DCB:DIO = 100:0 | 0.826 | 6.79 | 39.3 | 2.20 |
| P4:PC$_{61}$BM = 1:2 | DCB:DIO = 100:0 | 0.688 | 2.06 | 33.7 | 0.48 |

DCB: ortho-dichlorobenzene;
DIO: diiodooctane

Example 8

Characterization of Polymer Donor:PC$_{71}$BM Blend Morphology

Figure 4:
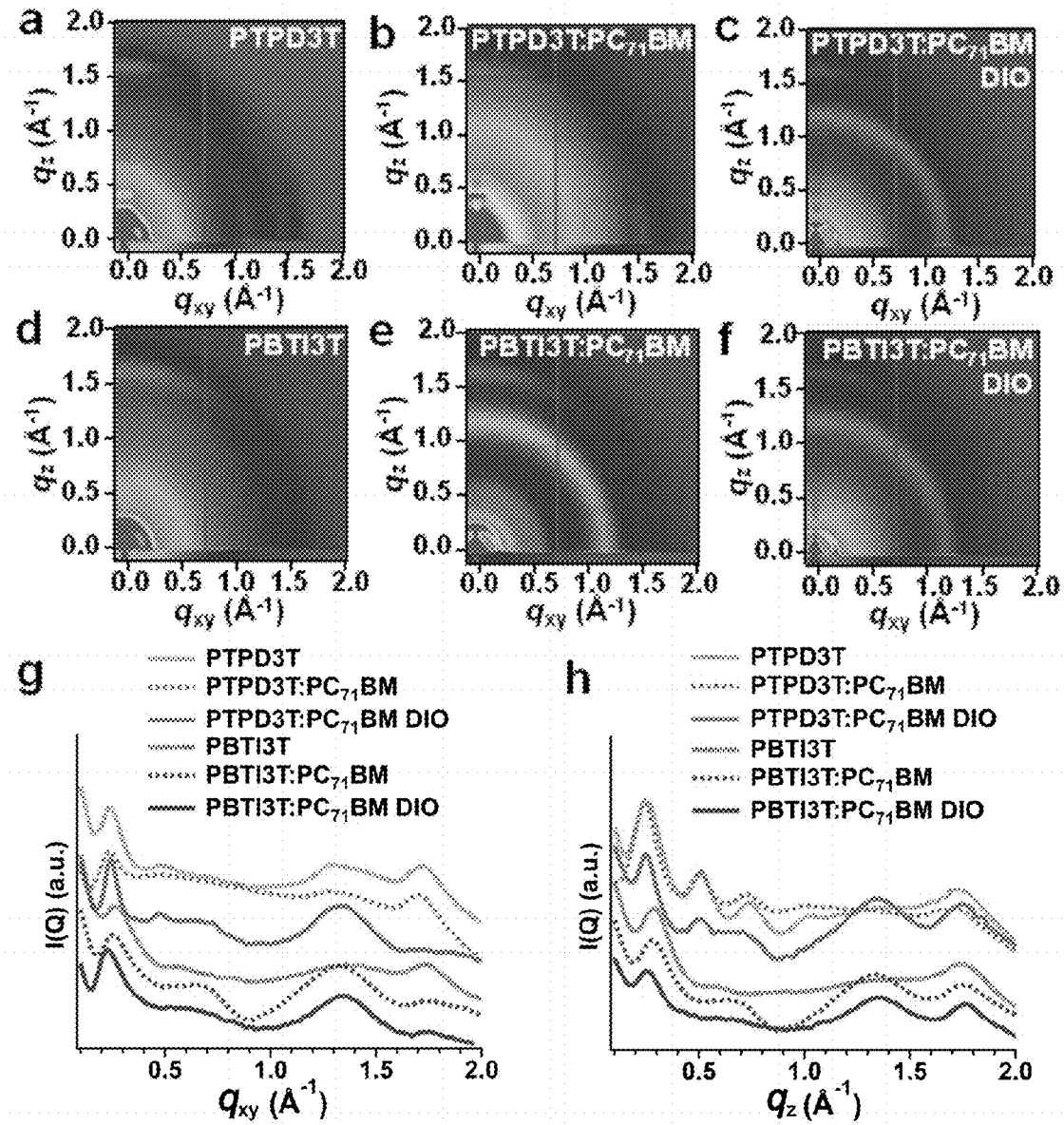
FIG. 4 shows the grazing incidence wide-angle X-ray scattering (GIWAXS) data for neat and BHJ blend polymer films. a) 2D-GIWAXS image of neat P(TPD3T) film. b) 2D-GIWAXS image of P(TPD3T):$PC_{71}BM$ blend film without DIO. c) 2D-GIWAXS image of P(TPD3T):$PC_{71}BM$ blend film with DIO as the processing additive. d) 2D-GI- WAXS image of neat P(BTI3T) film. e) 2D-GIWAXS image of P(BTI3T):PC$_{71}$BM blend film without DIO. f) 2D-GIWAXS image of P(BTI3T):PC$_{71}$BM blend film with DIO as the processing additive. g) In-plane linecuts of 2D GIWAXS of polymer films. h) Out-of-plane linecuts of 2D GIWAXS of polymer films.

Given the polymer donor:PC$_{71}$BM blend morphology plays a critical role in BHJ PSC performance, the neat and BHJ blend film microstructures were next characterized by grazing incidence wide-angle X-ray scattering (GIWAXS). In-plane (FIG. 4g) and out-of-plane (FIG. 4h) linecuts indicate mixed π-edge-on and π-face-on orientations with respect to the ZnO substrate plane for both P1 and P3 neat films as evidenced by the π-π stacking features (q~1.8 Å$^{-1}$) in the in-plane and out-of-plane linecuts. The ratio of the areas under the out-of-plane π-stacking reflection:in-plane π-stacking reflection provides a qualitative measure of the relative preference for π-face-on polymer orientation. For the neat films, the face-on:edge-on ratio is 2.1 and 1.7 for P1 and P3, respectively. The π-π stacking distance for the P3 neat film is 3.65 Å, slightly larger than 3.60 Å for P1. Note however that P3 exhibits a higher degree of ordered lamellar stacking, particularly in the edge-on orientation. After PC$_{71}$BM addition, the polymer crystallinity is only slightly reduced (FIGS. 4b and 4d), in contrast to the reduced crystallinity reported for many high-performance BHJ blends.

For the present blend films without DIO-aided processing, the P1 face-on:edge-on ratio increases to 8.1, indicating increased preference for face-on orientation, while P3 continues to show mixed orientations (face-on:edge-on ratio=1.5). In the blend films with DIO-aided processing, the measured π-π stacking distances contract to remarkably short spacings of 3.62 Å and 3.56 Å for P3:PC$_{71}$BM and P1:PC$_{71}$BM, respectively. In contrast, reported π-π stacking distances for other high-performance BHJ donor polymers are typically somewhat longer, 3.65-3.90 Å. Without wishing to be bound by any particular theory, the high FFs of the present polymers are believed to be connected with the unusually close π-π stacking distances. Furthermore, note that DIO addition promotes essentially complete π-face-on orientation for the P3:PC$_{71}$BM films and predominant face-on orientation for the P1:PC$_{71}$BM films (face-on:edge-on ratio=14). To the inventors' knowledge, this is the first report of donor polymer π-face-on preferential orientation on ZnO in an inverted PSC. High degrees of BHJ ordering, close donor polymer interplanar spacings, and preferential π-face-on orientation are characteristics which are believed to promote sizeable carrier mobilities and efficient charge collection.

The polymer:PC$_{71}$BM blend film morphologies were next investigated by TEM, AFM, and XPS. TEM images (FIG. 5b) of P1:PC$_{71}$BM blend indicate lateral nanoscale phase separation with 10-20 nm domain sizes when DIO was used in the film processing, versus 30-80 nm domain sizes without DIO. Without wishing to be bound by any particular theory, the addition of DIO is believed to increase the interfacial area for exciton dissociation significantly, in addition to promoting bicontinuous interpenetrating network formation. Without DIO, separate toroid-shaped domains are observed which lack effective percolation connectivity for efficient charge transport. AFM images reveal a similar trend: nanoscale phase separation and interpenetrating networks emerge with DIO-aided processing. Such interpenetrating networks have reduced grain boundaries and should provide continuous pathways for carrier migration to their respective electrodes, and by suppressing charge accumulation and non-germinate recombination, should favor high FFs and J$_{sc}$s.

Figure 5:
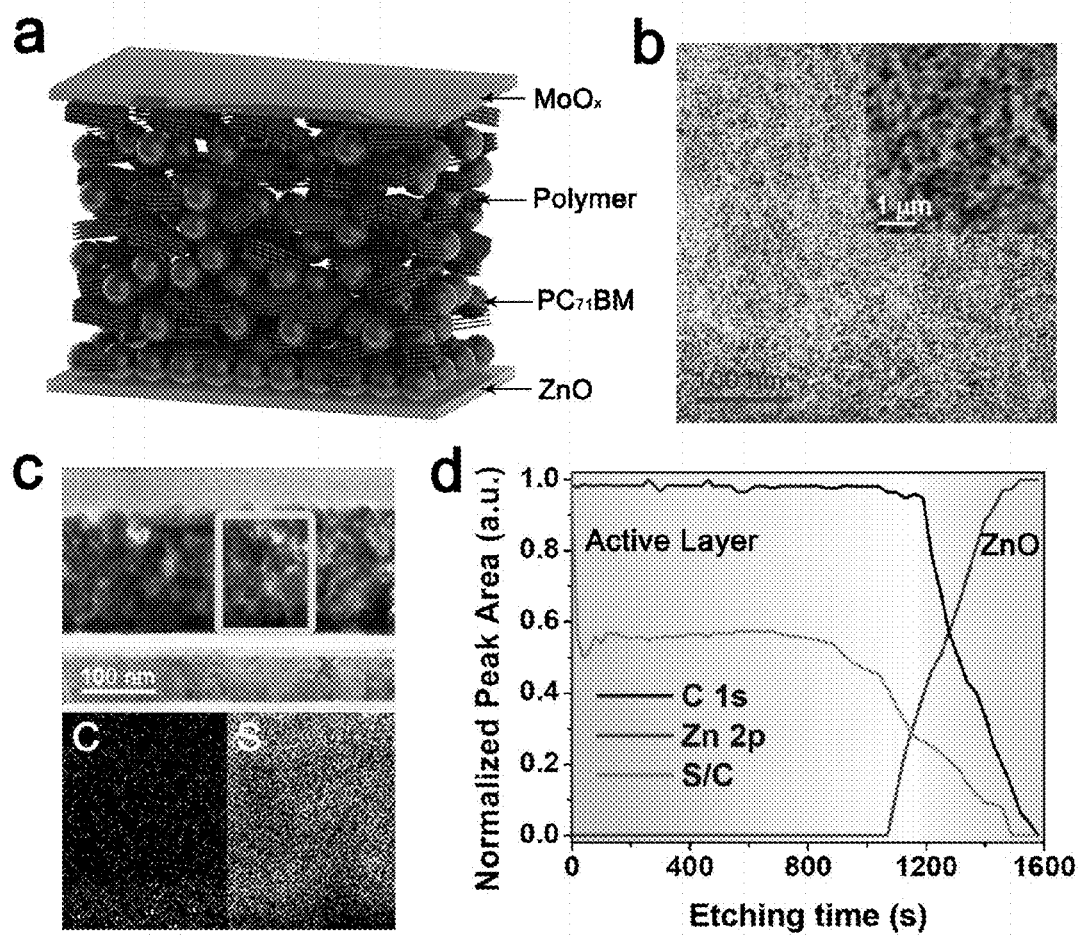
FIG. 5 shows the morphology of a P(BTI3T):PC$_{71}$BM film yielding optimal solar cell performance. a) Schematic diagram of the P(BTI3T):PC$_{71}$BM blend film, showing vertical phase gradation with a polymer-rich layer near the MoO$_x$/blend interface and a PC$_{71}$BM-rich layer near the blend/ZnO interface. b) TEM image of a P(BTI3T):PC$_{71}$BM blend film; inset shows AFM topographical image. c) TEM cross-sectional image and EDS carbon and sulfur mappings of an optmized P(BTI3T):PC$_{71}$BM inverted solar cell; EDS mappings performed simultaneously on the TEM cross-sectional sample across the active layer. d) XPS depth profile of a P(BTI3T):PC$_{71}$BM blend film showing the S/C ratio evolution as the function of etching time, where etching begins at the air/film interface.

TEM cross-sectional images of optimized P1:PC$_{71}$BM devices (FIG. 5c) also reveal a PC$_{71}$BM-rich layer near the ZnO interface. In substantiation, S and C mapping of the active layer cross-sections by energy-dispersive X-ray spectroscopy (EDS) reveals a C-rich layer at the blend/ZnO interface, distinct from the bulk film. Correspondingly, the S content at this interface is significantly lower, again indicating PC$_{71}$BM enrichment near the blend/ZnO interface. Complementary depth-profiled XPS was also used to probe S and C content on proceeding from the air/BHJ interface, through the active layer, and to the buried active layer/ZnO interface. Changes in the S/C ratio (FIG. 5d) also indicate vertical phase gradation, with P1/P3 enrichment at the blend/air interface, and PC$_{71}$BM-enrichment at the blend/ZnO interface. This gradation likely arises at least in part from differences in the polymer and PC$_{71}$BM surface energies, and their interactions with ZnO. FIG. 5a shows a schematic diagram of the polymer:PC$_{71}$BM blend microstructure. Note that polymer-enriched and PCBM-enriched layers would function as charge-blocking regions to suppress electron-leakage to the MoO$_x$-coated anode and hole leakage to the ZnO-coated cathode, respectively, thereby reducing interfacial charge recombination.

In summary and without wishing to be bound by any particular theory, the high fill factors of the present polymers are believed to be ascribable to π-face-on orientations, crystalline film microstructures, very close π-π interplanar spacings, ordered BHJ interpenetrating networks; and vertical donor-acceptor phase gradation.

All publications, including but not limited to patents and patent applications, cited in this specification are herein incorporated by reference as if each individual publication were specifically and individually indicated to be incorporated by reference herein as though fully set forth.

The present teachings encompass embodiments in other specific forms without departing from the spirit or essential characteristics thereof. The foregoing embodiments are therefore to be considered in all respects illustrative rather than limiting on the present teachings described herein. Scope of the present invention is thus indicated by the appended claims rather than by the foregoing description, and all changes that come within the meaning and range of equivalency of the claims are intended to be embraced therein.

The invention claimed is:

1. An organic photovoltaic device comprising an anode, a cathode, and in between the anode and the cathode a photoactive layer, the photoactive layer comprising an electron-donor compound and an electron-acceptor compound, wherein the electron-donor compound is a polymer of the formula:

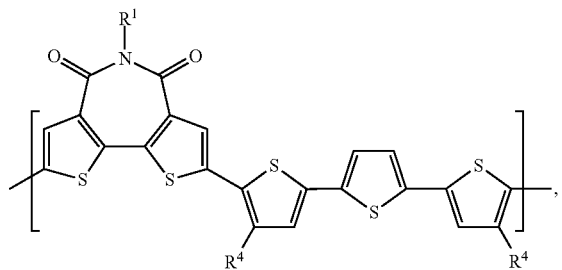

wherein

R$^1$ is selected from the group consisting of a C$_{1-40}$ alkyl group, a C$_{2-40}$ alkenyl group, and a C$_{1-40}$ haloalkyl group; and R$^4$, at each occurrence, independently is selected from the group consisting of a -L-C$_{1-40}$ alkyl group, a -L-C$_{2-40}$ alkenyl group, and a -L-C$_{1-40}$ haloalkyl group, wherein L, at each occurrence, is selected from the group consisting of O, S, and a covalent bond, and each of the C$_{1-40}$ alkyl group and the C$_{2-40}$ alkenyl group optionally is substituted with 1-10 substituents independently selected from the group consisting of a halogen, —CN, —NH$_2$, —NH(C$_{1-20}$ alkyl), —N(C$_{1-20}$ alkyl)$_2$, —SiH$_3$, —SiH(C$_{1-20}$ alkyl)$_2$, —SiH$_2$(C$_{1-20}$ alkyl), —Si(C$_{1-20}$ alkyl)$_3$, an —O—C$_{1-20}$ alkyl group, and an —S—C$_{1-20}$ alkyl group.

2. The device of claim 1, wherein R$^1$ is selected from the group consisting of a branched C$_{3-40}$ alkyl group, a branched C$_{4-40}$ alkenyl group, and a branched C$_{3-40}$ haloalkyl group.

3. The device of claim 1, wherein R$^4$, at each occurrence, independently is selected from the group consisting of a -L-C$_{6-40}$ alkyl group, a -L-C$_{6-40}$ alkenyl group, and a -L-C$_{6-40}$ haloalkyl group, wherein L, at each occurrence, is selected from the group consisting of O, S, and a covalent bond.

4. The device of claim 1, wherein the polymer has a molecular weight in the range of about 3,000 to about 300,000.

5. The device of claim 1, wherein the photoactive component comprises a blend material comprising the electron-donor compound and the electron-acceptor compound.

6. The device of claim 1, wherein the electron-acceptor compound is [6,6]-phenyl-C$_{61}$-butyric acid methyl ester (PC$_{61}$BM) or [6,6]-phenyl-C$_{71}$-butyric acid methyl ester (PC$_{71}$BM).

7. The device of claim 1, wherein the device comprises one or more cathode interlayers.

8. The device of claim 1, wherein the device comprises one or more anode interlayers.

9. The device of claim 1, wherein the device has a power conversion efficiency of at least about 5%.

10. The device of claim 1, wherein the device has a power conversion efficiency of at least about 8%.

11. The device of claim 1, wherein the device has a power conversion efficiency of at least about 9%.

* * * * *